United States Patent
Kasahara et al.

(10) Patent No.: US 6,756,608 B2
(45) Date of Patent: Jun. 29, 2004

(54) SEMICONDUCTOR DEVICE AND METHOD OF MANUFACTURING THE SAME

(75) Inventors: Kenji Kasahara, Atsugi (JP); Naoki Makita, Osaka (JP); Takuya Matsuo, Osaka (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/227,549

(22) Filed: Aug. 26, 2002

(65) Prior Publication Data

US 2003/0089911 A1 May 15, 2003

(30) Foreign Application Priority Data

Aug. 27, 2001 (JP) ........................................ 2001-255893

(51) Int. Cl.[7] .............................................. H01L 29/04
(52) U.S. Cl. .............................. 257/72; 257/65; 257/66
(58) Field of Search .......................................... 257/72

(56) References Cited

U.S. PATENT DOCUMENTS

| | | | |
|---|---|---|---|
| 5,767,530 A | * 6/1998 | Ha | 257/72 |
| 6,057,557 A | * 5/2000 | Ichikawa | 257/59 |
| 6,157,421 A | * 12/2000 | Ishii | 349/43 |
| 6,251,712 B1 | 6/2001 | Tanaka et al. | |
| 6,355,509 B1 | 3/2002 | Yamazaki | |
| 6,542,143 B1 | * 4/2003 | Ozawa | 345/98 |
| 2002/0102776 A1 | 8/2002 | Yamazaki et al. | |
| 2002/0134981 A1 | 9/2002 | Nakamura et al. | |

FOREIGN PATENT DOCUMENTS

| | | |
|---|---|---|
| JP | 08-330602 | 12/1996 |
| JP | 408330602 A | * 12/1996 |

* cited by examiner

Primary Examiner—Douglas Wille
(74) Attorney, Agent, or Firm—Eric J. Robinson; Robinson Intellectual Property Law Office, P.C.

(57) ABSTRACT

A semiconductor device which has satisfactory characteristics is provided. The semiconductor device includes a TFT manufactured by using a satisfactory crystalline semiconductor film and a circuit manufactured by using the TFT. An n-type impurity element (typically, phosphorous) is added to a gettering region of an n-channel TFT. A p-type impurity element (typically, boron) and a rare gas element (typically, argon) are added to a gettering region of a p-channel TFT. Then, there is performed heat treatment for gettering a catalytic element that remains in a semiconductor film.

67 Claims, 17 Drawing Sheets

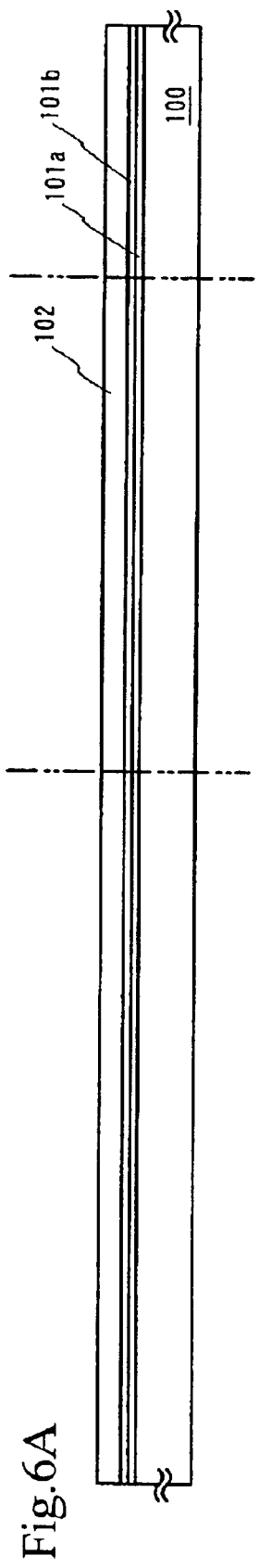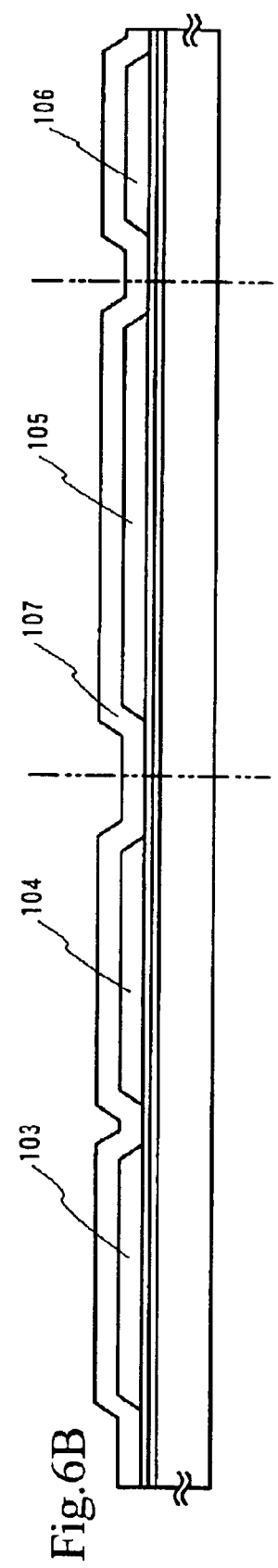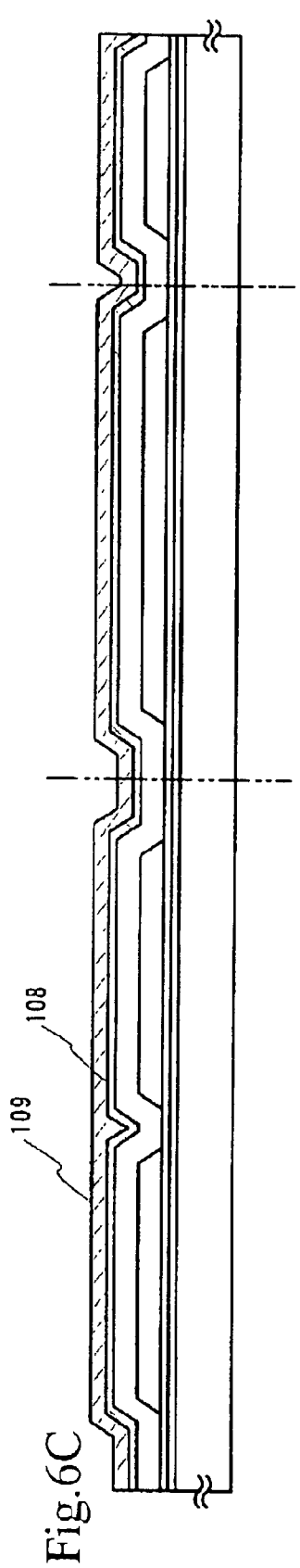

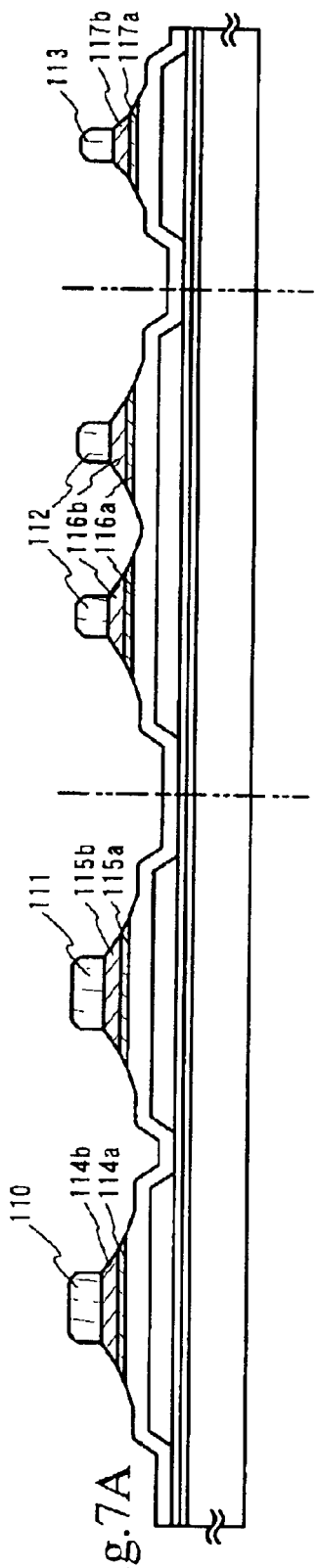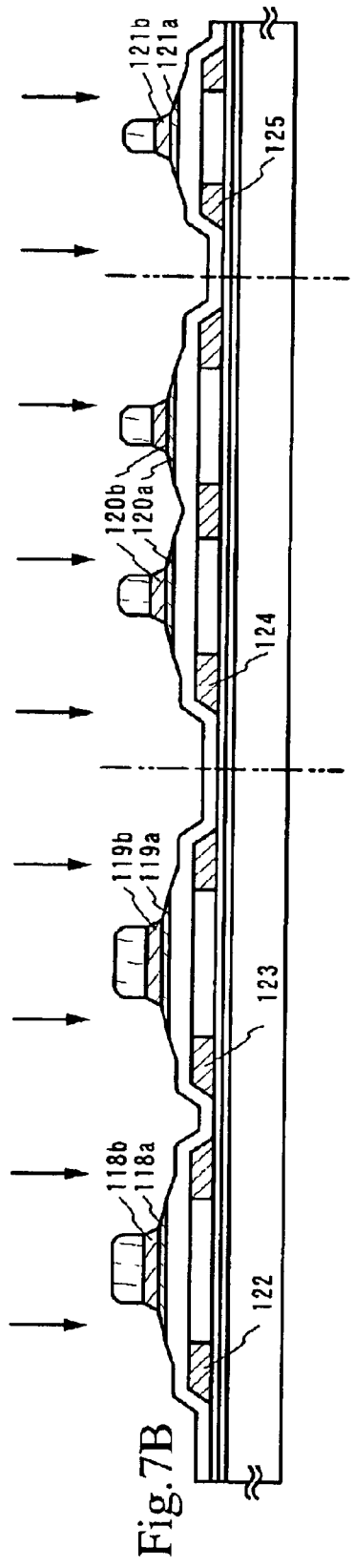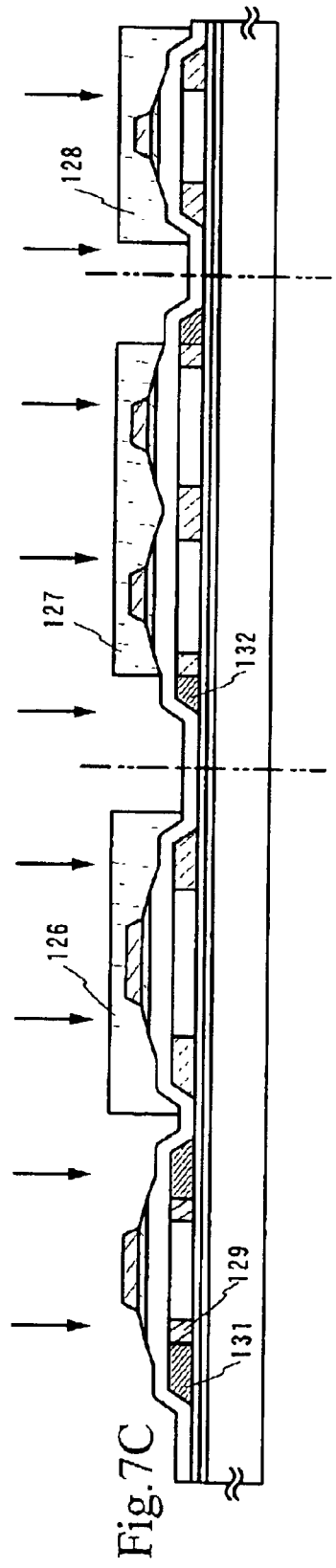

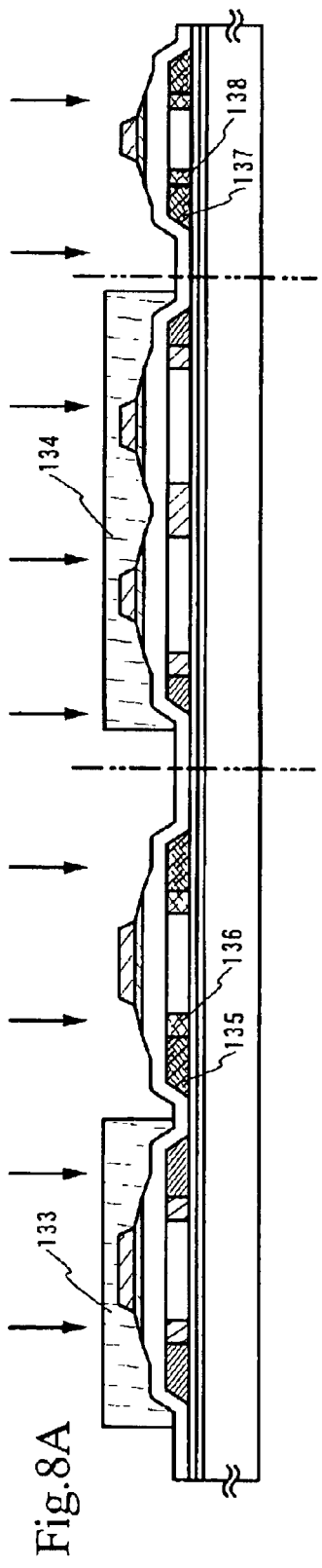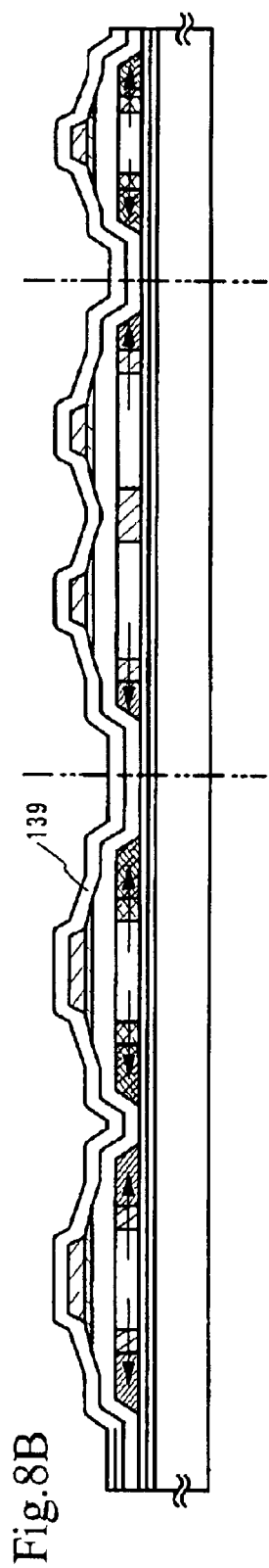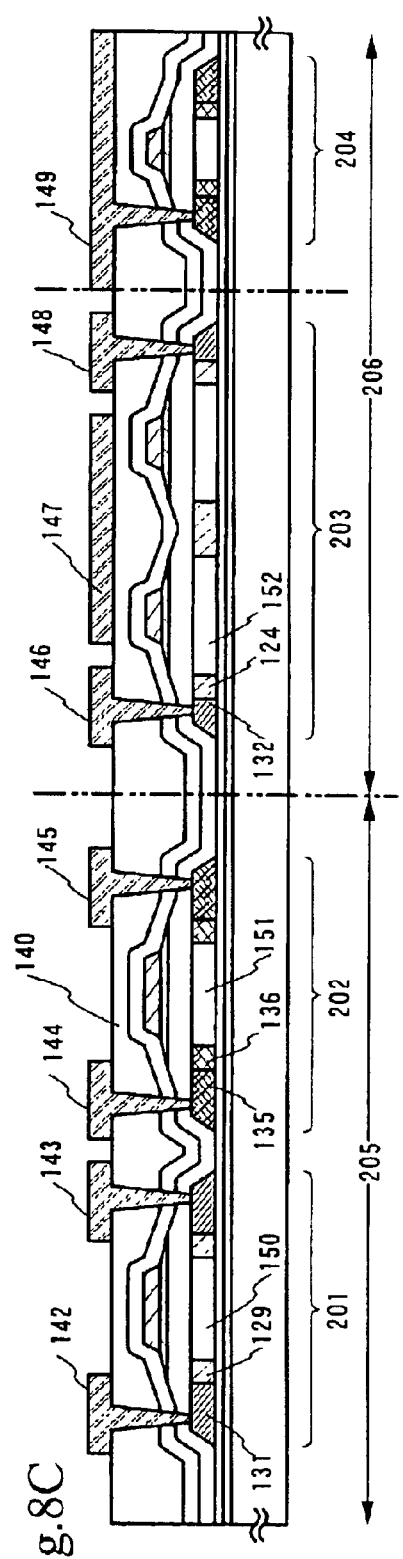

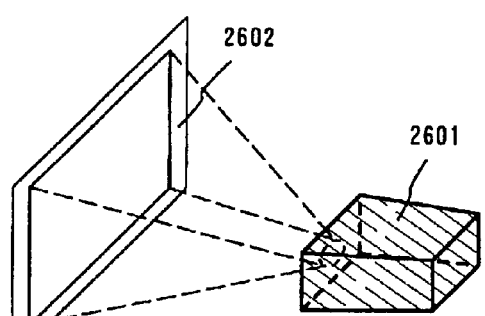
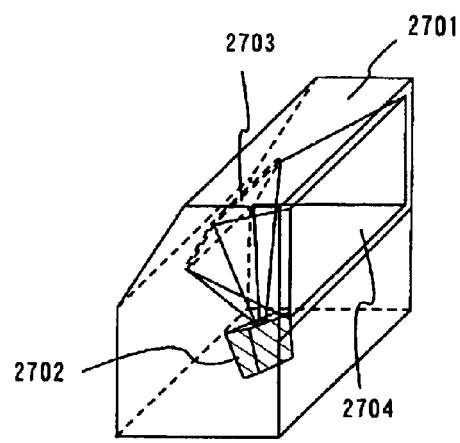
Fig.13A
Fig.13B
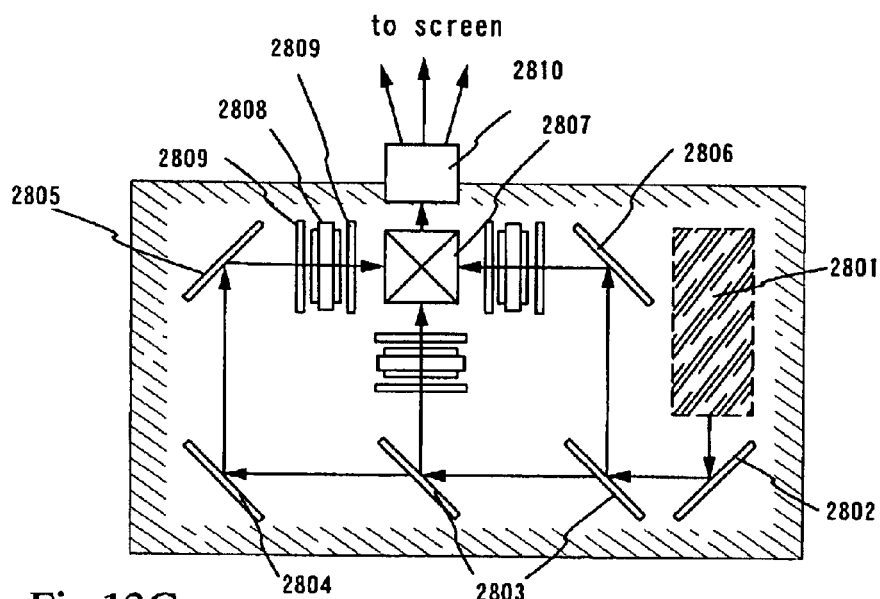
Fig.13C
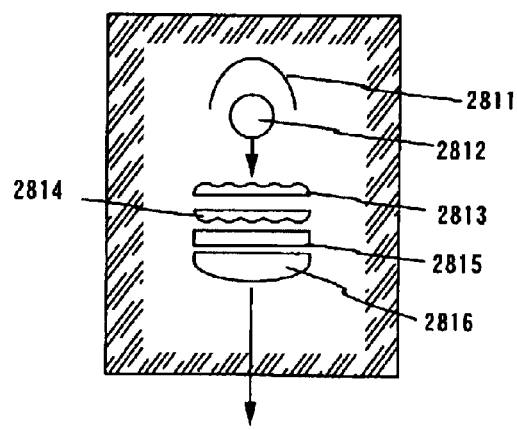
Fig.13D

SEMICONDUCTOR DEVICE AND METHOD OF MANUFACTURING THE SAME

BACKGROUND OF THE INVENTION

1. Field of the Invention

The present invention relates to a thin film transistor (hereinafter referred to as TFT) in which a crystalline semiconductor film is used for a semiconductor layer, and to a semiconductor device in which the TFT is used as a switching element in a driver circuit or a pixel portion (particularly, liquid crystal display device). In particular, the present invention relates to a TFT and a semiconductor device, in which a crystalline semiconductor film formed by using a catalytic element that promotes crystallization is used.

2. Description of the Related Art

There have been active studies on a liquid crystal display device (also referred to as liquid crystal panel) in which a TFT is used as a switching element in a pixel portion, in particular, a liquid crystal display device in which a driver circuit and a pixel portion are formed on the same substrate. The TFT uses a crystalline semiconductor film (typically, a crystalline silicon film) that has high electric field effect mobility and fast movement of carriers to enable high speed operation, instead of a TFT in which an amorphous semiconductor film (typically, an amorphous silicon film) is used. The above-described liquid crystal display devices are being sold in actuality.

A method of irradiating laser light, a thermal crystallization method by heating, a method using a catalytic element, and the like can be given as methods for manufacturing a crystalline silicon film.

In the case of using a crystalline semiconductor film formed by using a catalytic element for a semiconductor layer of a TFT, the catalytic element used for crystallization of a semiconductor film is moved to a gettering region from an element region (particularly, a channel forming region) of the TFT in order to improve characteristics of a semiconductor device. Thus, after an element which has a gettering action is added to form the gettering region, heat treatment is conducted.

As gettering processes, there are given and used: a method in which an impurity element that imparts one conductivity (n-type) to a semiconductor layer and has a gettering action is added to a source region or a drain region after a crystalline semiconductor film is formed, and heat treatment is conducted to perform activation of the impurity element and gettering of a catalytic element in the same step; a method in which an impurity element which has a gettering action is added to a region except an element region of a semiconductor film to successively form a gettering region after a crystalline semiconductor film is formed, and heat treatment is conducted to perform gettering of a catalytic element; and other methods.

In case of the former method, an n-type impurity element (typically, phosphorous) at high concentration is uniformly added to the gettering region (that later becomes a source region or a drain region) of each of an n-channel TFT and a p-channel TFT. Therefore, the source region or the drain region of the p-channel TFT has to be doped with a p-type impurity element at a concentration twice to three times as high as that of the n-type impurity element in order to reverse n-type to p-type. Thus, a process for adding impurities takes a long time, and there is a problem of throughput.

Further, the excessive addition of ions that become acceptors causes a problem of manufacturing cost and a problem that crystallinity of a semiconductor film is broken and it is difficult for the semiconductor film to be recrystallized to raise a resistance and lead to reduction of an on current.

Therefore, the inventors of the present invention performed evaluation on a gettering efficiency of several samples shown in Table 1 below in order to find a way of sufficiently gettering a catalytic element without excessively adding an impurity element to a source region or a drain region that becomes a gettering region in a p-channel TFT. FIGS. 2 to 5 each show a state in which etch pits are observed. In FIGS. 2 to 5 each, the sizes of channel forming regions are 5, 10, 15, 20, 30, and 50 $\mu$m from the upper portion in the figure. The evaluation is also performed on the size of the channel forming region in which gettering can be sufficiently performed.

TABLE 1

| | Added Element | | | |
|---|---|---|---|---|
| | P | B | Ar | After Gettering |
| Sample A | ○ | X | X | Gettering Efficiency: ○ EtchPit: No |
| Sample B | ○ | X | ○ | Gettering Efficiency: ○ EtchPit: Large |
| Sample C | X | ○ | X | Gettering Efficiency: Δ EtchPit: Large |
| Sample D | X | ○ | ○ | Gettering Efficiency: ○ EtchPit: No |

The present inventors selectively remove $NiSi_x$ in order to find the gettering efficiency after the heat treatment for gettering, and the gettering efficiency is evaluated based on the number of holes that occur after the removal. The hole is called an etch pit. In the case where the etch pit is not observed in the channel forming region, it is evaluated that the catalytic element that remained in the channel forming region can be moved to the gettering region.

It is considered that the catalytic element (Ni) is bonded to Si to become $NiSi_x$ in a process that the catalytic element moves from the channel forming region to the gettering region. A silicon oxide film is removed with a mixed solution containing 7.13% ammonium bifluoride ($NH_4HF_2$) and 15.4% ammonium fluoride ($NH_4F$) (made by Stella Chemifa Corp., trade name: LAL500), and a sample substrate is immersed in an aqueous solution of chemicals mixed with a volume ratio of HF (concentration of 50%): $H_2O_2$ (concentration of 33%): $H_2O$=45:72:4500 (hereinafter referred to as FPM) for 40 minutes, whereby $NiSi_x$ can be selectively removed. The holes are generated in the portions where $NiSi_x$ is removed. The holes formed after removing $NiSi_x$ can be observed as black points of the samples in a transmission mode of a light microscope. Note that the black point is referred to as the etch pit in this specification.

Even a base insulating film (silicon oxide film), which is formed at the substrate side of the silicon film, is removed due to a processing time of etching and an aqueous solution of chemicals for processing, and thus, the etch pit becomes somewhat larger than the original size of $NiSi_x$. However, since precipitated $NiSi_x$ is removed, the etch pit is considered to have substantially the size of $NiSi_x$.

Here, the present inventors direct their attention to the fact that there is a large difference in the state after etching among samples A, B, and D which are judged form that the gettering efficiency is sufficiently high (the etch pit is not seen even with the size of the channel forming region of 15 ìm). In the sample B, the etch pit with a large hole-shape can be observed while in the sample A and the sample D, the etch pit can not be observed. What is seen as a dot shape in the sample D is seemed to be a flaw that is generated on the surface of the silicon film at the time of adding the impurity element. The present inventors surmised that it is difficult to occur the precipitation of $NiSi_x$ in the sample A and the sample D, in other words, Ni exists (is solubilized) as an element in silicon lattices. Further, as to the sample D, they considered that a p-type impurity element is added at high concentration and strong p-type conductivity is imparted, whereby there is reached the state that boron (B) and nickel (Ni) are easily bonded to each other and NiSix becomes difficult to be generated. Further, $NiSi_x$ is easy to precipitate when phosphorous (P) and argon (Ar) exist in the gettering region.

There has been a problem that an off current suddenly rises in a TFT for which a crystalline semiconductor film formed by using a catalytic element is used. The inventors of the present invention consider that $NiSi_x$ precipitates in a defect of a semiconductor layer in the crystalline semiconductor film formed by using the catalytic element, in particular, $NiSi_x$ precipitates in a junction portion between a channel forming region and a source region or drain region, as a result, off current suddenly rises.

Then, the present inventors consider that, if only P is added to a gettering region of an n-channel TFT; B and Ar are added to a gettering region of a p-channel TFT; and then gettering is performed, a catalytic element (Ni) can be gettered from a region used as an element in a state that the catalytic element (nickel) singly exists (is solubilized) in silicon lattices with suppressing precipitation of $NiSi_x$.

SUMMARY OF THE INVENTION

The present invention has been made in view of the above, and has its object to realize a TFT which has good characteristics by gettering a catalytic element with suppressing precipitation of $NiSi_x$ in the entire region that becomes elements to form a high-quality crystalline semiconductor layer, and manufacturing a TFT using the above-described crystalline semiconductor layer.

Another object of the present invention is to realize a semiconductor device with good characteristics which includes a circuit manufactured by using the above-described TFT.

In the present invention, a gettering region (a region to which phosphorous (P) is added) of a semiconductor layer, which is a region that later becomes an n-channel TFT, is not doped with a rare gas element such as argon (Ar) but with only an n-type impurity element with a gettering action, typically phosphorous (P). A gettering region (a region to which boron (B) is added) of a region that becomes a p-channel TFT is doped with a rare gas element such as argon (Ar) which has an action of enhancing a gettering effect, in addition to a p-type impurity element which has a gettering action, typically boron (B). Then, gettering is performed. Thus, gettering of a catalytic element (nickel) is performed so as not to precipitate $NiSi_x$ and so as to obtain a solubilized state that nickel (Ni) exists as an element in a lattice of silicon. The gettering of a catalytic element is performed so that precipitation of little $NiSi_x$ is generated in a source region or a drain region of the semiconductor layer, in particular, in a junction portion between a channel forming region and the source region or drain region. Accordingly, the semiconductor device according to the present invention is provided. The concentration of the n-type impurity element in the source region or the drain region of the n-channel TFT is $5 \times 10^{19}$ to $5 \times 10^{21}/cm^3$. Further, the concentration of the p-type impurity element in the source region or the drain region of the p-channel TFT is $1 \times 10^{19}$ to $5 \times 10^{21}/cm^3$. Moreover, the concentration of the rare gas element in the source region or the drain region of the p-channel TFT is $1 \times 10^{19}$ to $1 \times 10^{22}/cm^3$.

According to the present invention, the impurity element to be added to the gettering region is changed in accordance with the conductivity of the TFT, whereby the catalytic element can be sufficiently moved to the gettering region from the semiconductor layer (the channel forming region). Thus, the precipitation of $NiSi_x$, considered to adversely affect characteristics of the TFT, can be suppressed, and throughput can be improved. Further, a semiconductor device in which reliability is improved can be realized.

BRIEF DESCRIPTION OF THE DRAWINGS

In the accompanying drawings:

FIGS. 6A to 6C show an embodiment according to the present invention;

FIGS. 7A to 7C show the embodiment according to the present invention;

FIGS. 8A to 8C show the embodiment according to the present invention;

FIGS. 13A to 13D show examples of electric equipment;

DETAILED DESCRIPTION OF THE PREFERRED EMBODIMENTS

Figure 1A:
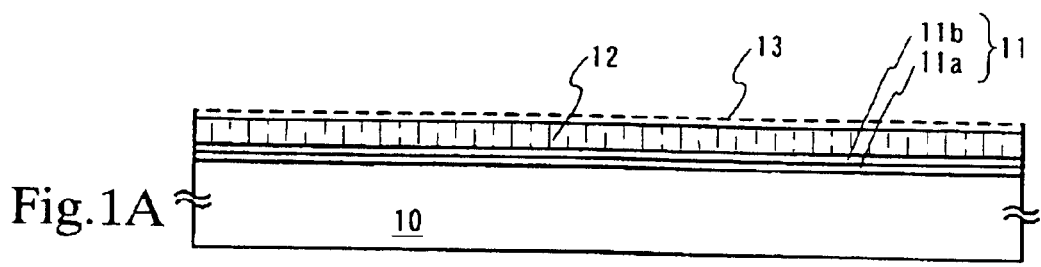
FIGS. 1A to 1E show an embodiment mode of the present invention.
Figure 1B:
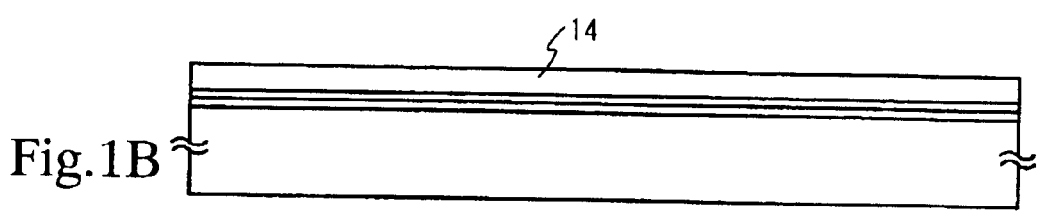
Figure 1C:
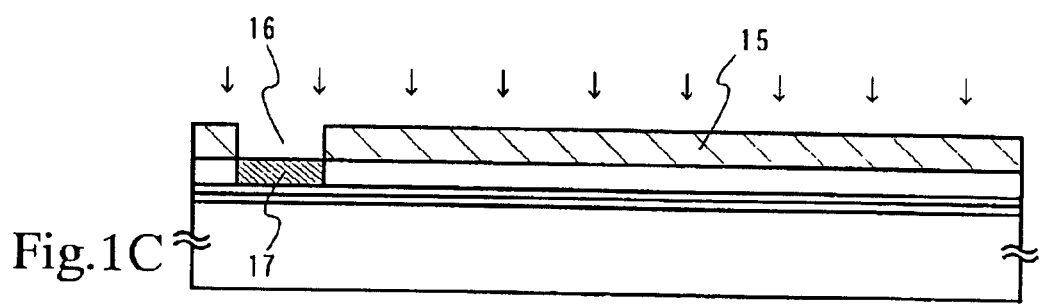
Figure 1D:
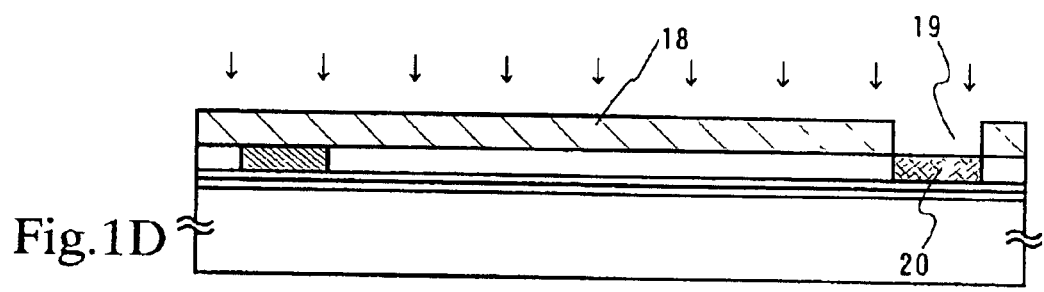
Figure 1E:
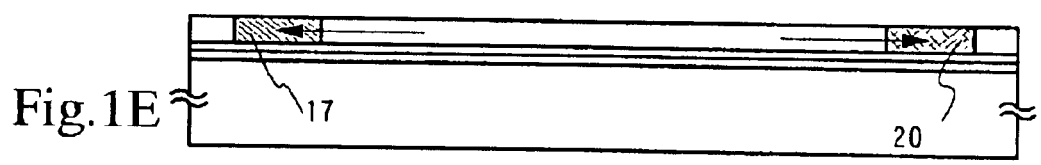
Figure 2:
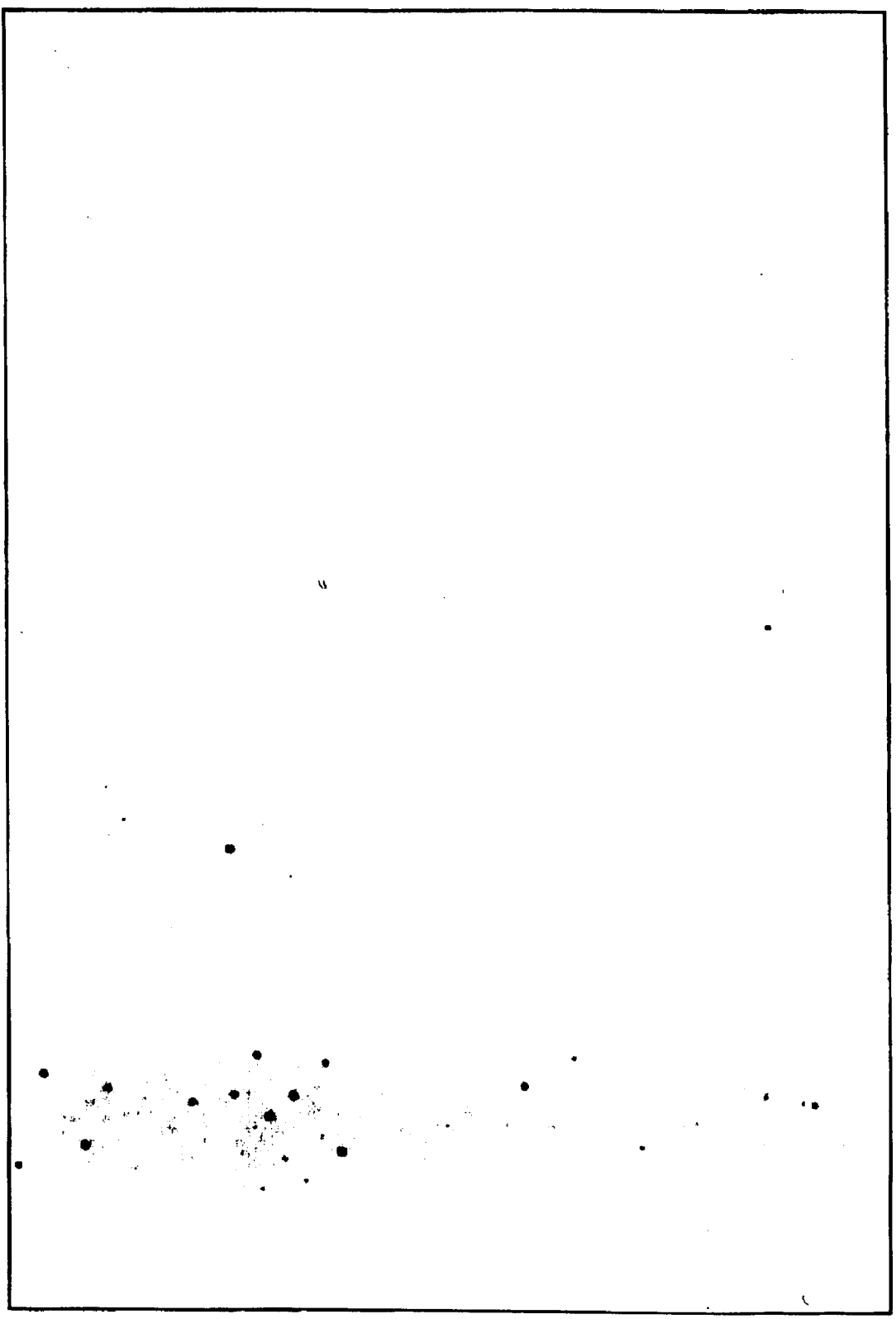
FIG. 2 shows a result of observation of etch pits.
Figure 3:
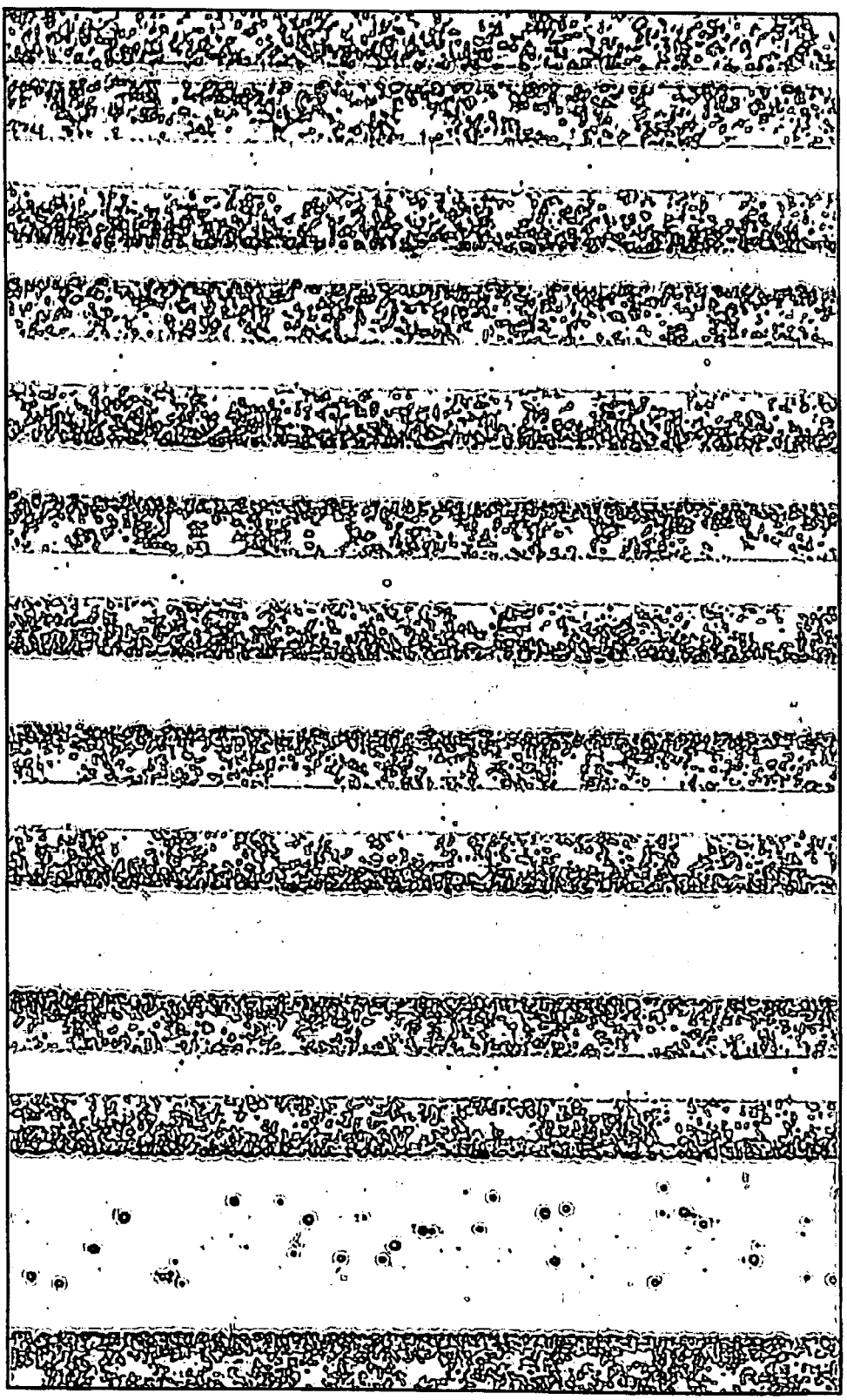
FIG. 3 shows a result of observation of etch pits.
Figure 4:
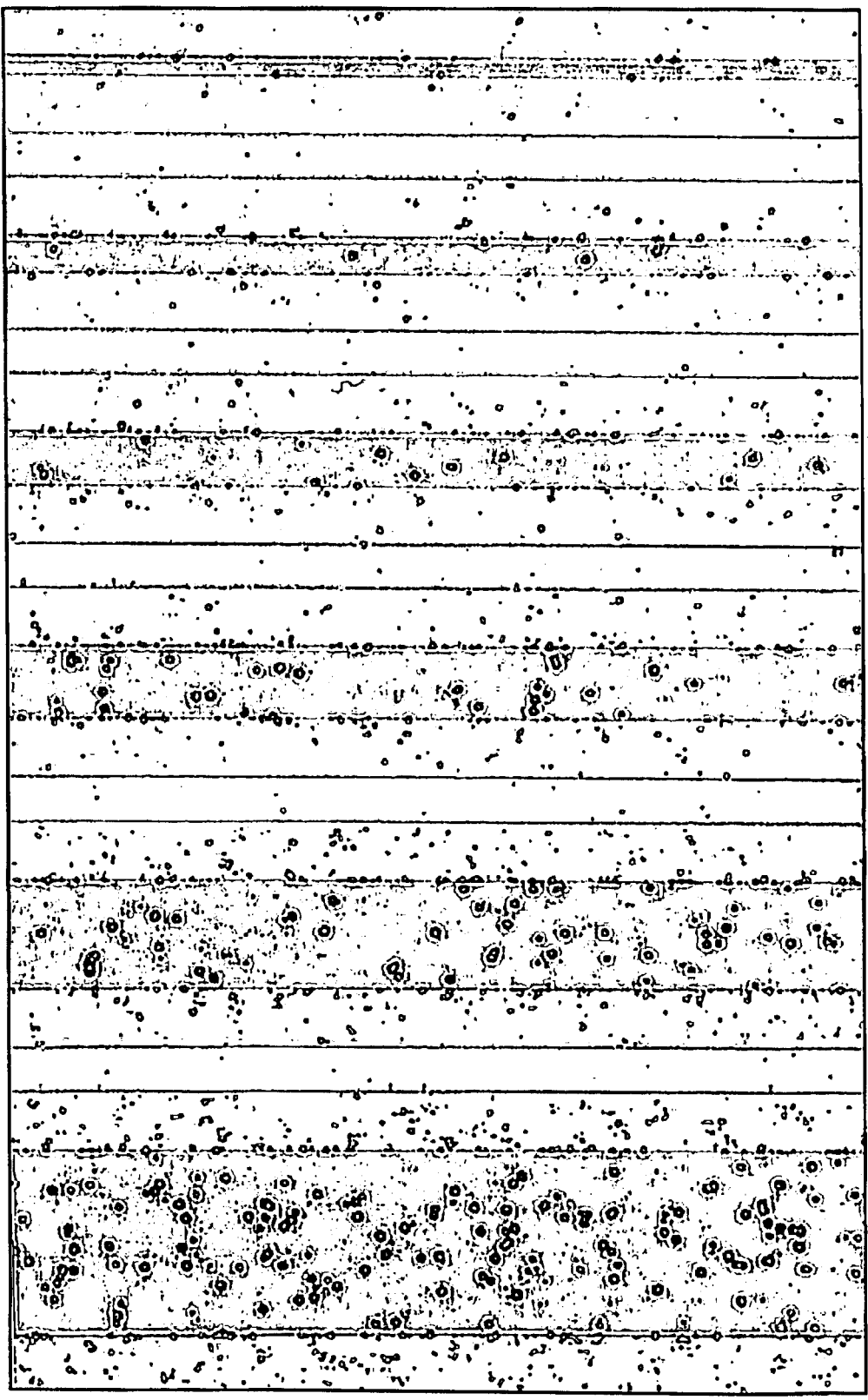
FIG. 4 shows a result of observation of etch pits.
Figure 5:
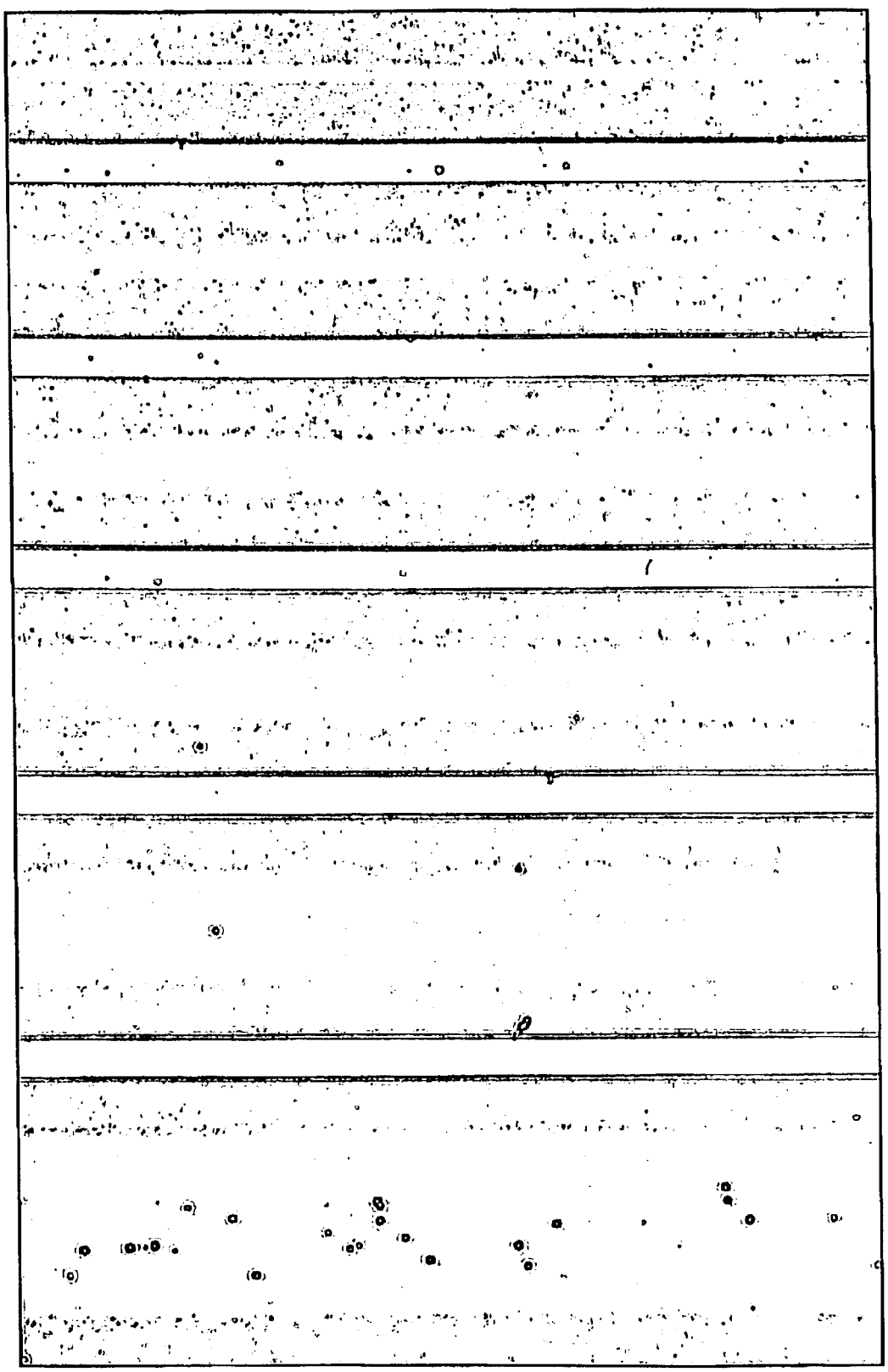
FIG. 5 shows a result of observation of etch pits.

An embodiment mode of the present invention will be described with reference to FIGS. 1A to 1E. A base insulating film is formed on a substrate, and an amorphous silicon film is formed on the base insulating film. Barium borosilicate glass, alumino borosilicate glass, or quartz can be used for the substrate. On the surface of a substrate 10, an inorganic insulating film is formed as a base insulating film 11 to have a thickness of 10 to 200 nm. As an example of the base insulating film, a silicon oxynitride film manufactured by plasma CVD may be used. In this embodiment mode, a lamination layer of a 50 nm thick silicon oxynitride film 11a formed from $SiH_4$, $NH_3$, and $N_2O$ and a 100 nm thick silicon oxynitride film 11b formed from $SiH_4$ and $N_2O$ is used as the base insulating film 11. The base insulating film 11 is formed to prevent alkaline metal contained in a glass substrate from diffusing in a semiconductor layer, and thus, this step can be omitted in case of using a quartz substrate. Subsequently, an amorphous semiconductor film 12 is formed on the base insulating film 11. Typically, silicon or silicon germanium may be used. In this embodiment mode, the amorphous semiconductor film 12 is formed with a thickness of 10 to 100 nm by using plasma CVD, low pressure CVD, or sputtering. In order to obtain a high-quality crystalline semiconductor film, the concentration of an impurity element such as oxygen, nitrogen, or carbon contained in the amorphous silicon film 12 needs to be reduced as much as possible. Therefore, it is desirable that a material gas with high purity is used or a CVD apparatus dealt in ultra-high vacuum is used. Further, the base insulating film 11 and the amorphous silicon film 12 are continuously formed without exposure to the atmosphere, whereby the concentration of the impurity element can be reduced.

Subsequently, a metal element which has an action of promoting crystallization (hereinafter referred to as catalytic element) is added to the surface of the amorphous silicon film 12. Examples of the catalytic elements include nickel (Ni), ferrum (Fe), cobalt (Co), ruthenium (Ru), palladium (Pa), osmium (Os), iridium (Ir), platinum (Pt), copper (Cu), and gold (Au). One or a plurality of kinds selected from the group consisting of the above-described elements can be used. Nickel (Ni) is typically used. A catalytic element containing layer 13 is formed by applying a nickel acetate salt solution containing 1 to 10 ppm nickel by weight with a spinner (spin coating). The catalytic element containing layer 13 may also be formed by addition with plasma processing, evaporation, or sputtering. In the case where nickel is applied by spin coating, since the surface of the semiconductor film such as the silicon film is hydrophobic, an ozone containing aqueous solution is applied to the surface of the amorphous silicon film to form an extremely thin oxide film, the oxide film is etched using a mixed solution of hydrofluoric acid and hydrogen peroxide solution to form a clean surface, and the surface is processed with the ozone containing aqueous solution again to form an extremely thin oxide film, in order to satisfactorily make the surface stick to the nickel containing solution. Accordingly, the nickel acetate salt solution can be uniformly applied.

Next, heat treatment is conducted at 500° C. for 1 hour to release hydrogen contained in the amorphous silicon film. Then, heat treatment is conducted at 580° C. for 4 hours to form a crystalline semiconductor film (crystalline silicon film) 14.

Thereafter, crystalline silicon film 14 may be irradiated with laser light to repair defects that remain in crystal grains and enhance crystallinity. Note that excimer laser with a wavelength of 400 nm or less or second harmonic or third harmonic of YAG laser is used for the laser light. In any case, pulse laser light with a repetition frequency of about 10 to 1000 Hz is used, the laser light is condensed to 100 to 400 mJ/cm$^2$ by an optical system, and irradiation of the laser light is performed to the crystalline semiconductor film with an overlap ratio of 90 to 95%.

The catalytic element at high concentration remains in the crystalline silicon film 14 obtained by the above step. It has been recognized that the catalytic element that remains in the silicon film precipitates irregularly, and the precipitation is seen particularly in a grain boundary. Thus, if a TFT element is formed while the catalytic element remains in the silicon film, the precipitation becomes an escape (leak path) of a faint current, which becomes a cause of sudden increase of an on current (a current at the time when the TFT is in an off state). Thus, a problem of fluctuating characteristics arises. Therefore, it is necessary to reduce the concentration of the catalytic element in the crystalline silicon film, in particular, in a region that becomes a channel forming region of the TFT.

Then, a region to which the catalytic element is moved (hereinafter referred to as gettering region) is formed. A mask 15 formed of a silicon oxide film is formed on the crystalline silicon film 14. The mask 15 is formed with an opening portion 16 for forming a first gettering region. An impurity element is added to the exposed crystalline silicon film through the opening portion 16 to form a first gettering region 17. Note that the first gettering region 17 is doped with an impurity element imparting n-type conductivity (typically, phosphorous).

Phosphorous (P) is added to the first gettering region 17 by ion doping using phosphine (PH$_3$) diluted with hydrogen. The concentration of the added phosphorous (P) is $5 \times 10^{19}$ to $5 \times 10^{21}$/cm$^3$, and preferably, $5 \times 10^{19}$ to $1 \times 10^{21}$/cm$^3$.

Next, a mask 18 formed of a silicon oxide film is formed in order to form a second gettering region. The mask 18 is formed with an opening portion 19 for forming the second gettering region. An impurity element is added to the exposed crystalline silicon film through the opening portion 19 to form a second gettering region 20. Note that the second gettering region 20 is doped with an impurity element imparting p-type conductivity (typically, boron) and a rare gas element (typically, argon).

Note that, in addition to argon (Ar), one or a plurality of kinds selected from the group consisting of helium (He), neon (Ne), krypton (Kr), and xenon (Xe) can be used as the rare gas element.

Boron (B) is added to the second gettering region 20 by ion doping using diborane (B$_2$H$_6$) diluted with hydrogen or rare gas. Further, argon (Ar) is added thereto by ion doping. The concentration of the added boron (B) is $1 \times 10^{19}$ to $5 \times 10^{21}$/cm$^3$, and preferably, $1 \times 10^{19}$ to $5 \times 10^{20}$/cm$^3$. The concentration of argon (Ar) is $1 \times 10^{19}$ to $1 \times 10^{22}$/cm$^3$.

Next, heat treatment for gettering is performed. It is sufficient that the heat treatment is performed at 450 to 800° C. for 1 minute to 24 hours by using any methods such as a heating method with a furnace or RTA (rapid thermal annealing) performed for a very short time. In this embodiment mode, the heat treatment is performed by jetting gas heated to 610° C. to the substrate to be processed for 5 minutes, whereby the catalytic element in the channel forming region is moved to the gettering region. Note that the gettering region may be removed by etching after the gettering step. Further, the conductivity imparted by the added impurity element differs between the gettering region 17 and the gettering region 20, and the concentration of the added impurity element is high. Thus, the gettering region can be used later as the source region or drain region of the TFT. Note that it can be considered that the concentration of the catalytic element is higher in the source region or the drain region used as the gettering region than in the channel forming region since the catalytic element moves to the gettering region after the heat treatment for gettering.

The crystalline semiconductor film obtained by using the catalytic element is the aggregate of crystals with a rod shape or needle shape, and is satisfactory in that growth is seen with a specific directionality when viewed macroscopically.

Furthermore, the concentration of the catalytic element that remains in the above-described semiconductor film with satisfactory crystallinity is sufficiently reduced, whereby characteristics of the semiconductor device manufactured by using the semiconductor film can be improved.

Embodiments
[Embodiment 1]

An embodiment of the present invention will be described below with reference to FIGS. 6A to 9. Here, a method of simultaneously manufacturing a pixel portion and TFTs (n-channel TFT and p-channel TFT) in a driver circuit provided in the periphery of the pixel portion on the same substrate is described in detail.

In FIG. 6A, a substrate 100 is formed of alumino borosilicate glass. A base insulating film 101 is formed on the substrate 100. In this embodiment, a 50 nm thick first silicon oxynitride film 101a is formed with $SiH_4$, $NH_3$, and $N_2O$ as reaction gas, and a 100 nm thick silicon oxynitride film 101b is formed with $SiH_4$ and $N_2O$ as reaction gas, to thereby form a lamination layer.

Semiconductor layers 103 to 106 (in this embodiment, referred to as a first semiconductor layer 103, a second semiconductor layer 104, a third semiconductor layer 105, and a fourth semiconductor layer 106 for the sake of convenience) are formed of a semiconductor film 102 with a crystalline structure. After an amorphous semiconductor film is formed on the base insulating film 101, heat treatment is conducted by using a catalytic element (Ni in this embodiment) and jetting an inert gas (here, nitrogen gas) heated to 610° C. to the substrate to be processed for 5 minutes, to thereby obtain a crystalline semiconductor film.

After the heat treatment, laser light may be irradiated to the crystalline semiconductor film in order to enhance the crystallinity more. The light of an excimer laser with a wavelength of 400 nm or less or a YAG laser of second harmonic or third harmonic is used for the laser light. In any case, pulse laser light with a repetition frequency of about 10 to 1000 Hz is used, the laser light is condensed to 100 to 400 $mJ/cm^2$ by an optical system, and the laser light is irradiated to the crystalline semiconductor film with an overlap ratio of 90 to 95%.

After the crystallization, boron as an acceptor type impurity is added to the semiconductor film by ion doping in order to control a threshold voltage of a TFT. The concentration of boron added may be appropriately determined by an operator. Note that boron may be added to the semiconductor film in an amorphous state.

The thus formed polycrystalline silicon film is divided by an etching process to form the semiconductor layers 103 to 106. A 110 nm thick silicon oxynitride film is formed thereon as a gate insulating film 107 which is formed by plasma CVD using $SiH_4$ and $N_2O$ (FIG. 6B).

Further, on the gate insulating film 107, a 30 nm thick tantalum nitride film is formed by sputtering as a first conductive film 108, and further, a tungsten film as a second conductive film 109 is formed with a thickness of 300 nm (FIG. 6C).

Next, as shown in FIG. 7A, a photosensitive resist material is used to form masks 110 to 113. Then, a first etching process is conducted to the first conductive film 108 and the second conductive film 109. ICP (inductively coupled plasma) etching is used for etching. Although there is no limitation on an etching gas, $CF_4$, $Cl_2$, and $O_2$ are used for etching the W film and tantalum nitride film. The gas flow rate is set to $CF_4:Cl_2:O_2=25:25:10$, and RF (13.56 MHz) power of 500 W is applied to a coil-shape electrode under a pressure of 1 Pa, to thereby perform etching. In this case, RF (13.56 MHz) power of 150 W is applied also to the substrate (sample stage) to substantially apply a negative self-bias voltage. Under the first etching conditions, mainly the W film is etched to have a predetermined shape.

Thereafter, the etching gas is changed to $CF_4$ and $Cl_2$, the gas flow rate is set to $CF_4:Cl_2=30:30$, and RF (13.56 MHz) power of 500 W is applied to the coil-shape electrode under a pressure of 1 Pa to generate plasma and perform etching for about 30 seconds. RF (13.56 MHz) power of 20 W is applied also to the substrate (sample stage) to substantially apply a negative self-bias voltage. The mixed gas of $CF_4$ and $Cl_2$ etches the tantalum nitride film and the W film at approximately the same rate. Accordingly, there are formed first shape gate electrodes 114 to 117 constituted of first electrodes 114a to 117a and second electrodes 114b to 117b which have a taper end portion. The taper portion is formed at 45° to 75°. In order to perform etching without residue, an etching time may be increased by approximately 10 to 20%. The region of the gate insulating film 107, which is not covered by the first shape gate electrodes 114 to 117, is etched and thinned by approximately 20 to 50 nm.

Next, as shown in FIG. 7B, a second etching process is conducted without removing the masks 110 to 113. $CF_4$, $Cl_2$, and $O_2$ are used as etching gas, the gas flow rate is set to $CF_4:Cl_2:O_2=20:20:20$, and RF (13.56 MHz) power of 500 W is applied to the coil-shape electrode under a pressure of 1 Pa to generate plasma and perform etching. RF (13.56 MHz) power of 20 W is applied also to the substrate (sample stage) to apply a lower self-bias voltage than that in the first etching process. Under the etching conditions, the W film used as the second conductive film is subjected to etching. Thus, there are formed second shape gate electrodes 118 to 121 constituted of third electrodes 118a to 121a and fourth electrodes 118b to 121b. The region of the gate insulating film 107, which is not covered by the second shape gate electrodes 118 to 121, is etched and thinned by approximately 20 to 50 nm. Note that the third electrodes and the fourth electrodes are also referred to as electrodes (A) and electrodes (B) for the sake of convenience in this specification.

Subsequently, a first doping process is conducted in which an impurity element that imparts n-type conductivity (an n-type impurity element) is added to the semiconductor layers. The first doping process is performed by ion doping in which ions are injected without mass segregation. In the doping process, the second shape electrodes 118 to 121 are used as masks, and a phosphine ($PH_3$) gas diluted with hydrogen is used to form n-type impurity regions 122 to 125 containing an n-type impurity element at a first concentration in the semiconductor films 103 to 106. The concentration of phosphorous in the n-type impurity regions 122 to 155 is set to $1\times10^{16}$ to $1\times10^{17}/cm^3$.

Thereafter, first masks 126 and 128 that cover a whole of second semiconductor layer 104 and a whole of fourth semiconductor layer 106, respectively, and a second mask 127 that covers a part of the third semiconductor layer 105 and the second shape gate electrode 120 over the third semiconductor layer 105, are formed. Then, a second doping process is performed. In the second doping process, an n-type impurity region 129 containing an n-type impurity element at a second concentration is formed in the first semiconductor layer 103 through the third electrode (electrode (A)) 118a. The concentration of phosphorous in the n-type impurity region 129 is set to $1\times10^{17}$ to $1\times10^{19}/cm^3$.

Subsequently, a third doping process is performed while the masks 126 to 128 remain as they are. An n-type impurity element is added to the first semiconductor layer 103 and the third semiconductor layer 105 through the gate insulating film 107 to form n-type impurity regions 131 and 132 containing an n-type impurity element at a third concentration. The concentration of phosphorous in the n-type impurity regions 131 and 132 is set to $5\times10^{19}$ to $5\times10^{21}/cm^3$.

In this embodiment, the impurity elements are added plural times as described above. However, the gate insulating film and the third electrodes of gate electrodes are controlled in film thickness or an accelerating voltage in doping is adjusted, whereby the n-type impurity regions containing an n-type impurity element at the second concentration and the n-type impurity regions containing an n-type impurity element at the third concentration can be formed simultaneously.

Next, as shown in FIG. 8A, masks 133 and 134 that cover the first semiconductor layer 103 and the third semiconductor layer 105, respectively, are formed, and then, a fourth doping process is conducted. In the doping process, diborane ($B_2H_6$) gas diluted with hydrogen or diborane gas diluted with rare gas is used, and a p-type impurity region 136 containing a p-type impurity element at a first concentration and a p-type impurity region 135 containing a p-type impurity element at a second concentration are formed in the second semiconductor layer 104. Further, in the fourth semiconductor layer 106 for a storage capacitor in the pixel portion, a p-type impurity region 138 containing a p-type impurity element at the first concentration and a p-type impurity region 137 containing a p-type impurity element at the second concentration are formed. The p-type impurity regions 136 and 138 are formed to overlap the electrodes (A) 119a and 121a, respectively, and are doped with boron in a concentration range of $1\times10^{18}$ to $1\times10^{20}/cm^3$. The p-type impurity regions 135 and 137 are doped with boron in a concentration range of $1\times10^{19}$ to $5\times10^{21}/cm^3$, preferably, $1\times10^{19}$ to $5\times10^{20}/cm^3$.

In this embodiment, the addition of the p-type impurity element (boron) is performed after the addition of the n-type impurity element (phosphorous) at a high concentration ($5\times10^{19}$ to $5\times10^{21}/cm^3$). However, it may be possible that the region that becomes the n-channel TFT is covered with a mask, the addition of the p-type impurity element (the fourth doping process in this embodiment) is conducted, and then, the addition of the n-type impurity element at the high concentration (the second doping process and the third doping process in this embodiment) is conducted.

Next, a rare gas element (Ar in this embodiment) is added while the masks 133 and 134 remain as they are. The crystalline structure of the semiconductor layer to which the rare gas element is added is broken to be amorphous. Note that the rare gas element exists without being coupled with silicon. The crystalline structure is broken as described above, whereby there is obtained the state that it is easy for the catalytic element to move to a gettering region from a channel forming region.

Through the above-described processes, the regions, to which phosphorous, or boron and argon are added, are formed in the respective semiconductor films. The second shape gate electrodes 118 to 120 become gate electrodes. Further, the second shape electrode 121 becomes one of capacitor electrodes of the storage capacitor in the pixel portion.

Next, as shown in FIG. 8B, heat treatment is performed in a heated inert gas atmosphere in order to activate the impurity elements added to the respective semiconductor films. In this embodiment, heat treatment is conducted for 5 minutes in a nitrogen gas heated to 610° C. In the heat treatment, there is also performed a process of moving the catalytic element used in the crystallization process of the semiconductor films to the gettering region (the source region or drain region of the n-channel TFT doped with phosphorous at high concentration, and the source region or drain region of the p-channel TFT doped with boron and argon at high concentration) from the channel forming regions of the TFTs.

The element which has a gettering action and is added to the gettering region of the n-channel TFT is only phosphorous (P), and it is difficult for $NiSi_x$ to be precipitated. Thus, gettering can be sufficiently performed. Further, the elements which has a gettering action and are added to the gettering region of the p-channel TFT are boron (B) and argon (Ar), and argon (Ar) compensates for the gettering efficiency of boron (B). Thus, gettering can be sufficiently performed. Therefore, by the above-described heat treatment, the catalytic element is moved to the gettering region, and the concentration of the catalytic element (Ni) that remains in the channel forming region can be reduced to $1\times10^{17}/cm^3$ or less, preferably, $1\times10^{16}/cm^3$ or less. Although the n-type impurity element is added to the gettering region of the p-channel TFT at a concentration of $1\times10^{16}$ to $1\times10^{17}/cm^3$, this concentration does not have the gettering action. Thus, the n-type impurity element does not adversely affect the gettering region of the p-channel TFT.

Thereafter, as shown in FIG. 8B, a first interlayer insulating film 139, which is formed of a silicon nitride film or a silicon oxynitride film, is formed to have a thickness of 50 nm by using plasma CVD. Then, heat treatment is conducted at 410° C. by using a clean oven to thereby perform hydrogenation of the semiconductor layers with hydrogen released from the silicon nitride film or the silicon oxynitride film.

Next, a second interlayer insulating film 140 is formed from acrylic on the first interlayer insulating film 139. Then, contact holes are formed. In this etching process, the first interlayer insulating film and the second interlayer insulating film in an external input terminal portion is formed are removed. Then, wirings 142 to 149 are formed by laminating a titanium film and an aluminum film.

Through the above steps, there can be formed on the same substrate a driver circuit 205 which has an n-channel TFT 201 and a p-channel TFT 202 and a pixel portion 206 which has a pixel TFT 203 and a storage capacitor 204. The storage capacitor 204 is constituted of the semiconductor layer 106, the gate insulating film 107, and the capacitor wiring 121.

The n-channel TFT 201 of the driver circuit 205 includes a channel forming region 150, the n-type impurity region 129 ($L_{ov}$ region) containing an n-type impurity element at the second concentration and overlapping the electrode (A) 118a of the gate electrode, and the n-type impurity region 131 containing an n-type impurity element at the third concentration which functions as the source region or drain region. The length of the $L_{ov}$ region in a channel length direction is 0.5 to 2.5 μm, preferably, 1.5 μm. The above-described structure of the $L_{ov}$ region is taken for preventing deterioration of the TFT mainly due to a hot carrier effect. The n-channel TFT and the p-channel TFT can constitute a shift resister circuit, a buffer circuit, a level shifter circuit, a latch circuit, and the like. Particularly, the structure of the n-channel TFT 201 is suitable for the buffer circuit in which a driving voltage is high for the purpose of preventing the deterioration due to the hot carrier effect.

The p-channel TFT 202 of the driver circuit 205 includes a channel forming region 151, the p-type impurity region 135 (the region that functions as the source region or drain region) containing a p-type impurity element at the second concentration outside of the electrode (A) 119a of the gate electrode, and the p-type impurity region 136 containing a p-type impurity element at the first concentration and overlapping the electrode (A) 119a.

The TFT (pixel TFT) 203 of the pixel portion 206 includes a channel forming region 152, the n-type impurity region 124 containing an n-type impurity element at the first concentration outside the electrode (A) 120a of the gate electrode, and the n-type impurity region 132 containing an n-type impurity element at the third concentration which functions as the source region or drain region. Further, the p-type impurity regions 137 and 138 are formed in the semiconductor layer 106 that functions as one of the electrodes of the storage capacitor 204.

As described above, in the present invention, arrangement can be appropriately determined in accordance with circuits that differ in operation conditions, for example, the driver circuit portion and the pixel portion.

Figure 9:
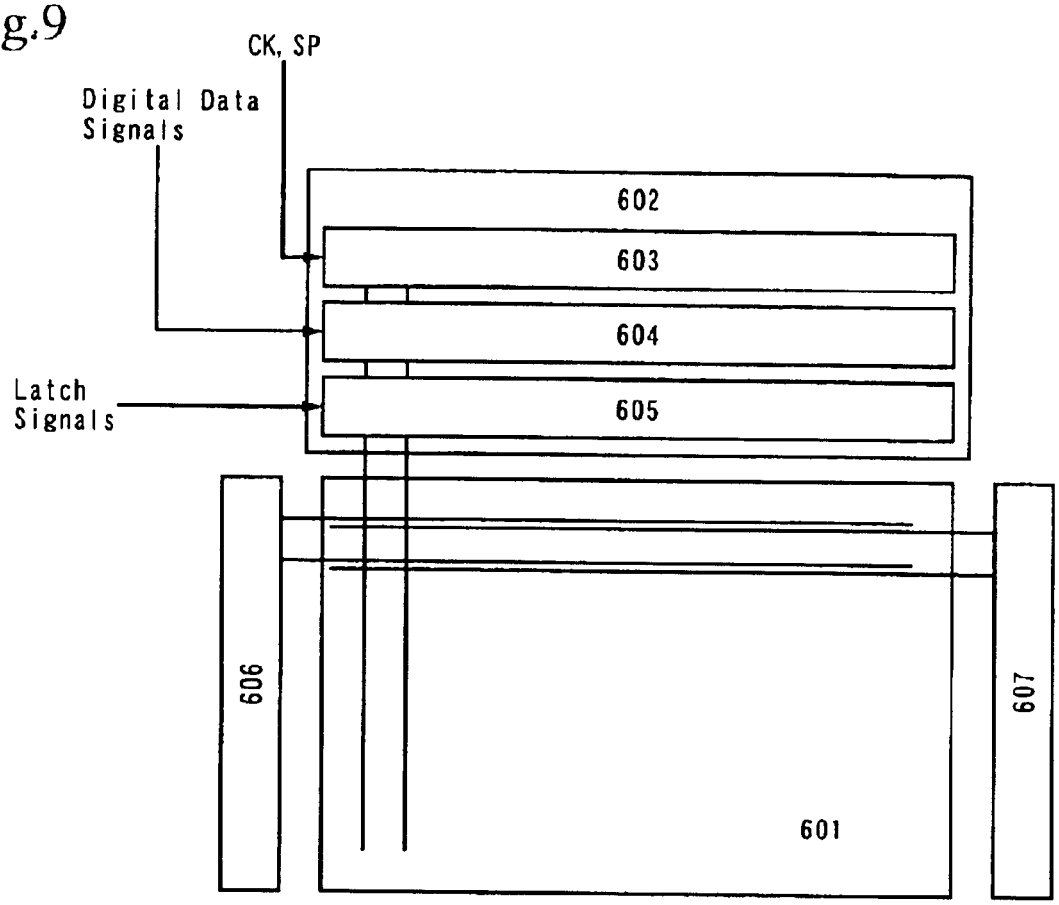
FIG. 9 shows the embodiment according to the present invention.

FIG. 9 is a circuit diagram showing an example of a circuit structure of an active matrix substrate. A pixel portion 601 formed by being incorporated with TFTs, a data signal line driver circuit 602, and scanning signal line driver circuits 606 and 607 are formed.

The data signal line driver circuit 602 is composed of a shift resister 603, latches 604 and 605, a buffer circuit, and the like. A clock signal and a start signal are input to the shift register 603, and a digital data signal and a latch signal are input the latches. Further, the scanning signal line driver circuit 606 is also composed of a shift resister, a buffer circuit, and the like. Although the number of pixels in the pixel portion 601 is arbitrary, 1024×768 pixels are provided in XGA.

A display device with active matrix drive can be formed by using the above-described active matrix substrate. When this embodiment is applied to a liquid crystal display device and the pixel electrode is formed from a light reflective material, a reflection type display device can be formed. A liquid crystal display device or a light emitting device in which a pixel portion is constituted of organic light emitting elements can be formed by using the above-described active matrix substrate. Accordingly, the active matrix substrate that is adapted for the reflection type display device can be manufactured.

[Embodiment 2]

Figure 10A:
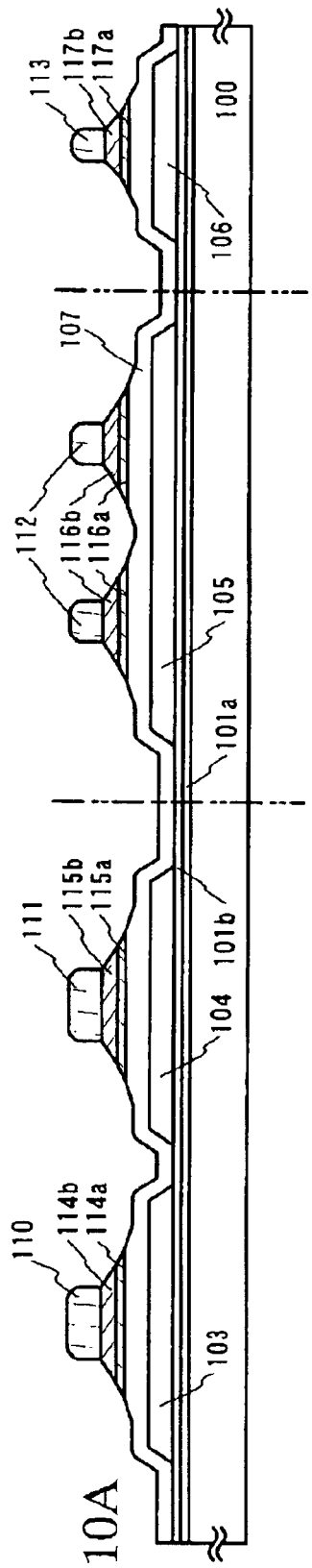
FIGS. 10A to 10C show an embodiment according to the present invention.
Figure 10B:
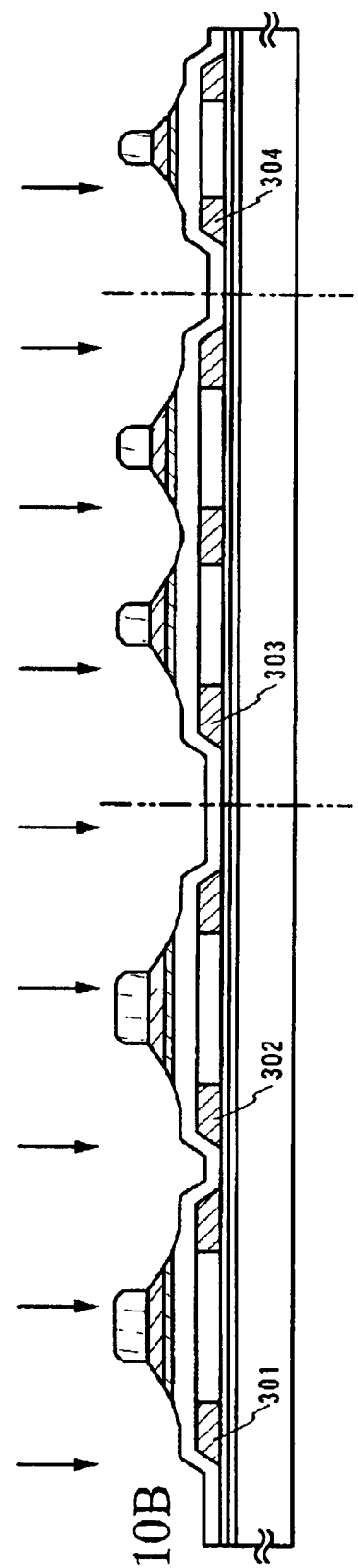
Figure 10C:
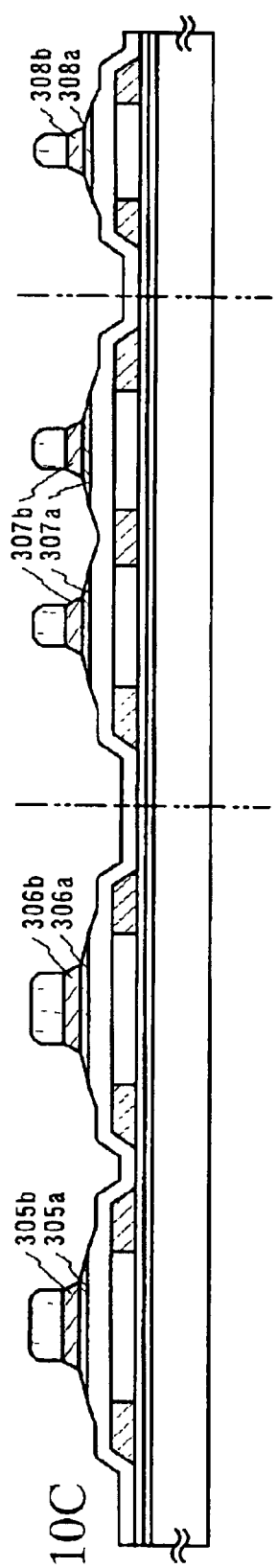

In this embodiment, another embodiment of a method of manufacturing a semiconductor device will be described with reference to FIGS. 10A to 10C. Note that the processes until the first etching process shown in FIG. 7A in accordance with Embodiment 1 are the same in this embodiment. FIG. 10A shows the state of the substrate on which the element that has undergone the processes until the first etching process shown in FIG. 7A is formed.

In FIG. 10A, there are provided the substrate 100, the base insulating film 101 (the base insulating film 101a formed of a silicon oxynitride film, and the base insulating film 101b formed of a silicon oxynitride film), the first to fourth semiconductor layers 103 to 106, the gate insulating film 107, and the first shape gate electrodes 114 to 117.

Here, a first doping process is conducted. The first to fourth semiconductor layers 103 to 106 are doped with an n-type impurity element to thereby form n-type impurity regions 301 to 304 containing a first concentration n-type impurity element at a low concentration of $1\times10^{15}$ to $1\times10^{17}/cm^3$.

Next, a second etching process is performed. The first shape gate electrodes 114 to 117 (constituted of the first electrodes 114a to 117a and the second electrodes 114b to 117b) are etched to form second shape gate electrodes 305 to 308 (electrodes (A) 305a to 308a and electrodes (B) 305b to 308b).

After the processes until this point are completed, the manufacturing process proceeds from the second doping process shown in FIG. 7C in Embodiment 1. As a result, the active matrix substrate shown in FIG. 8C can be manufactured.

[Embodiment 3]

In accordance with this embodiment, it is possible to apply the present invention to a manufacturing process of a bottom gate type TFT. The manufacturing process of a bottom gate type TFT will be described with reference to FIGS. 16A to 17C.

An insulating film such as a silicon oxide film, a silicon nitride film, or a silicon oxynitride film is formed (not shown) on a substrate 50, and a conductive film is formed in order to form a gate electrode. The conductive film is patterned to have a desired shape and form a gate electrode 51. As the conductive film, a conductive film, which is comprised of one element selected from the group consisting of Ta, Ti, W, Mo, Cr, and Al or contains one element selected from the group as its main constituent, may be used.

Next, a gate insulating film 52 is formed. The gate insulating film may be comprised of a single layer of a silicon oxide film, a silicon nitride film, or a silicon oxynitride film, or a lamination layer of any of the above films.

Subsequently, an amorphous silicon film 53 as an amorphous semiconductor film is formed with a thickness of 10 to 150 nm by thermal CVD, plasma CVD, low pressure CVD, evaporation, or sputtering. Since the gate insulating film 52 and the amorphous silicon film 53 can be formed by the same film deposition method, both the films may be continuously formed. With the continuous formation, there is no exposure to an atmosphere, and the contamination of the film surface can be prevented. Thus, variation of characteristics of the TFT to be manufactured and fluctuation of the threshold voltage can be reduced.

Then, a catalytic element that promotes crystallization is applied to the amorphous silicon film 53 to form a catalytic element containing layer 54. Thereafter, heat treatment is performed to form a crystalline silicon film.

After the crystallization process, there is formed a 100 to 400 nm thick insulating film 55 that protects the crystalline silicon film (a channel forming region) in the later process of adding impurities.

Next, using a mask formed of resist, an impurity element that imparts n-type conductivity is added to the crystalline silicon film that later becomes an active layer of an n-channel TFT at a concentration of $5\times10^{19}$ to $5\times10^{21}/cm^3$, preferably, $1\times10^{20}$ to $1\times10^{21}/cm^3$ To the crystalline silicon film that later becomes an active layer of a p-channel TFT, a p-type impurity element is added at a concentration of $1\times10^{19}$ to $5\times10^{21}/cm^3$, preferably, $1\times10^{20}$ to $5\times10^{21}/cm^3$, and a rare gas element is added at a concentration of $1\times10^{19}$ to $1\times10^{22}/cm^3$. As a result, a source region, a drain region, and an LDD region are formed.

Next, an activation process of the impurity elements added to the crystalline silicon film is performed. Capture (gettering) of the catalytic element applied to the silicon film in the crystallization process is also performed simultaneously with the activation. By the heat treatment, the catalytic element is moved to gettering regions that are: a region to which the n-type impurity element is added at high concentration; and a region to which the p-type impurity element and the rare gas element are added at high concentration.

Subsequently, the insulating film on the crystalline silicon film is removed, the crystalline silicon film is patterned to have a desired shape, and then, an interlayer insulating film 56 is formed. The interlayer insulating film is formed of an insulating film such as a silicon oxide film, a silicon nitride film, or a silicon oxynitride film to have a thickness of 500 to 1500 nm.

Thereafter, contact holes that reach the source regions and drain regions of the respective TFTs are formed, and wirings 57 for electrically connecting the respective TFTs are formed.

As described above, the present invention can be applied and used to TFTs with any shape.

[Embodiment 4]

In this embodiment, a process of manufacturing an active matrix liquid crystal display device from the active matrix substrate manufactured in accordance with any of Embodiments 1 to 3 will be described.

Figure 15:
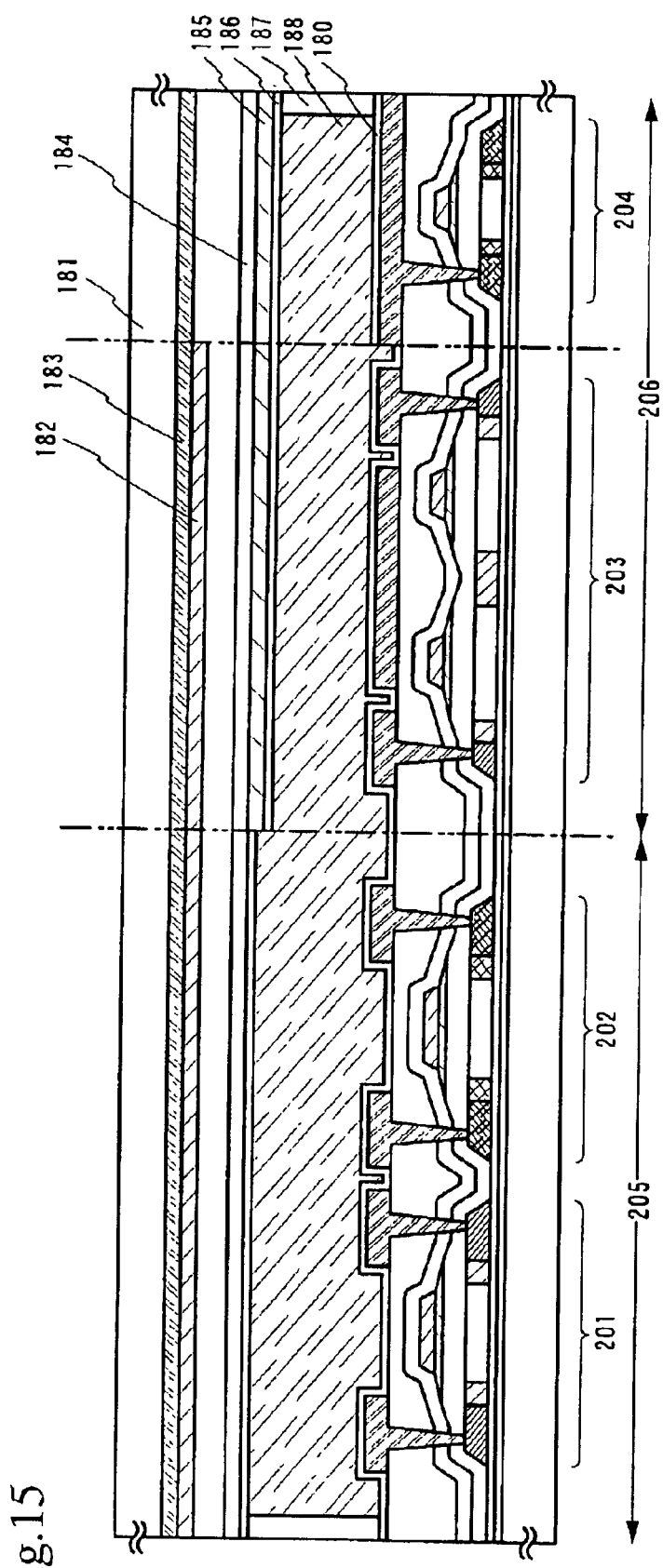
FIG. 15 shows an embodiment according to the present invention.
Figure 16A:
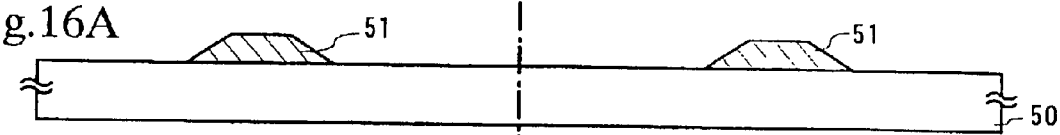
FIGS. 16A to 16D show an embodiment according to the present invention.
Figure 16B:
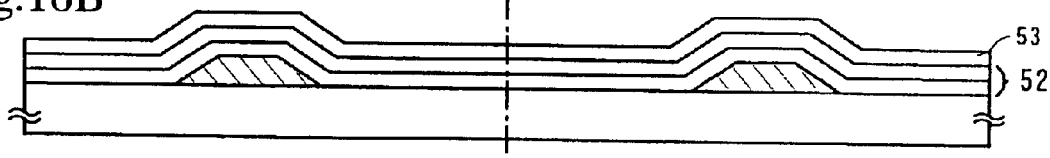
Figure 16C:
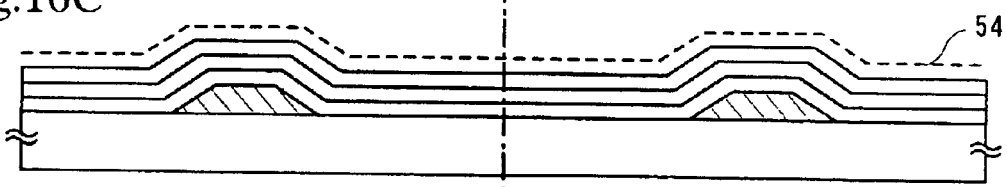
Figure 16D:
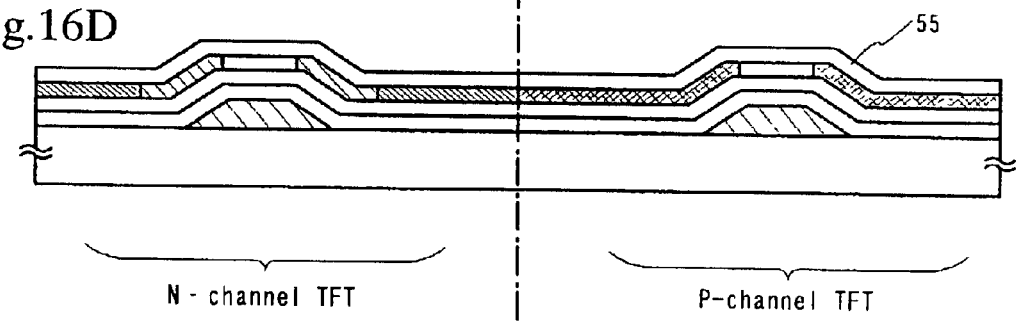
Figure 17A:
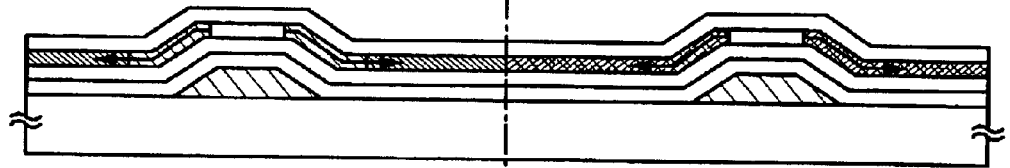
FIGS. 17A to 17C show the embodiment according to the present invention.
Figure 17B:
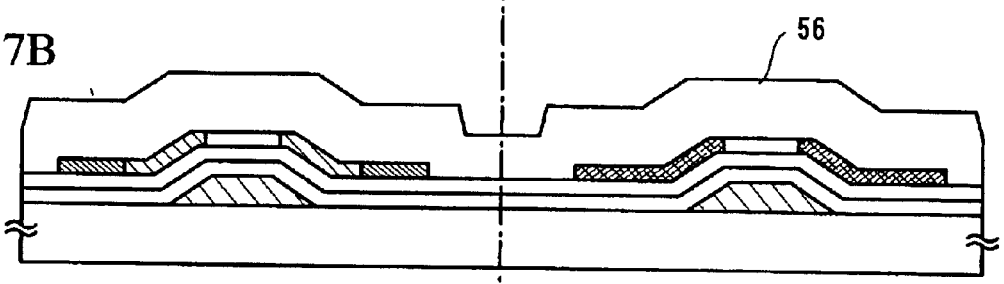
Figure 17C:
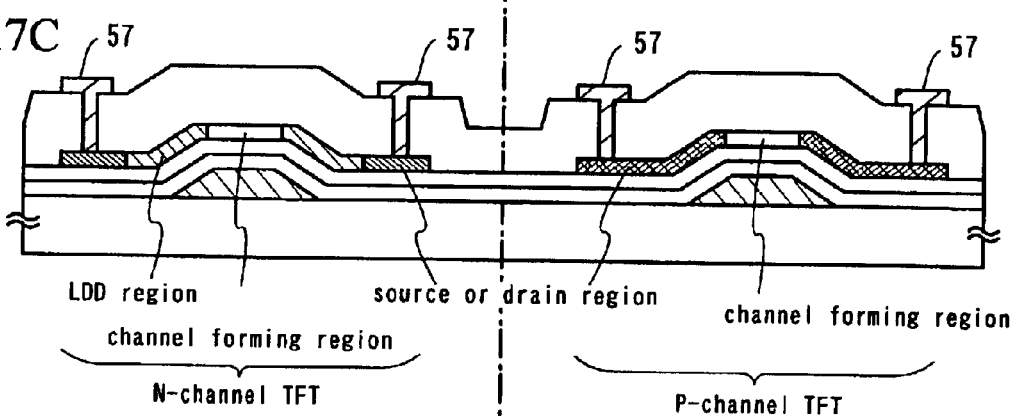

First, the active matrix substrate in the state of FIG. 8C is manufactured in accordance with Embodiment 1. Then, as shown in FIG. 15, an orientation film 180 is formed on the active matrix substrate, and a rubbing process is performed.

Next, a counter substrate 181 is prepared, and colored layers 182 and 183 and a leveling film 184 are formed on the counter substrate 181. The red colored layer 182 and the blue colored layer 183 are partially overlapped with each other to thereby be made to function as a light shielding film. Although not shown in FIG. 15, there exists a region where the red colored layer and a green colored layer are overlapped with each other to be made to function as a light shielding film.

Next, a counter electrode 185 is formed in the pixel portion. Then, an orientation film 186 is entirely formed, and a rubbing process is performed.

Subsequently, the active matrix substrate on which the pixel portion and the driver circuit are formed and the counter substrate on which the colored layers and the counter electrode are formed are bonded to each other by using a sealing material 187. The sealing material 187 is mixed with a filler. The two substrates can be bonded to each other with a uniform interval by using the filler and a columnar spacer. Thereafter, a liquid crystal material 188 is injected between the bonded substrates, and a sealant (not shown) seals completely. A known liquid crystal material may be used as the liquid crystal material 188. In this way, the active matrix liquid crystal display device shown in FIG. 15 is completed.

[Embodiment 5]

Figure 11A:
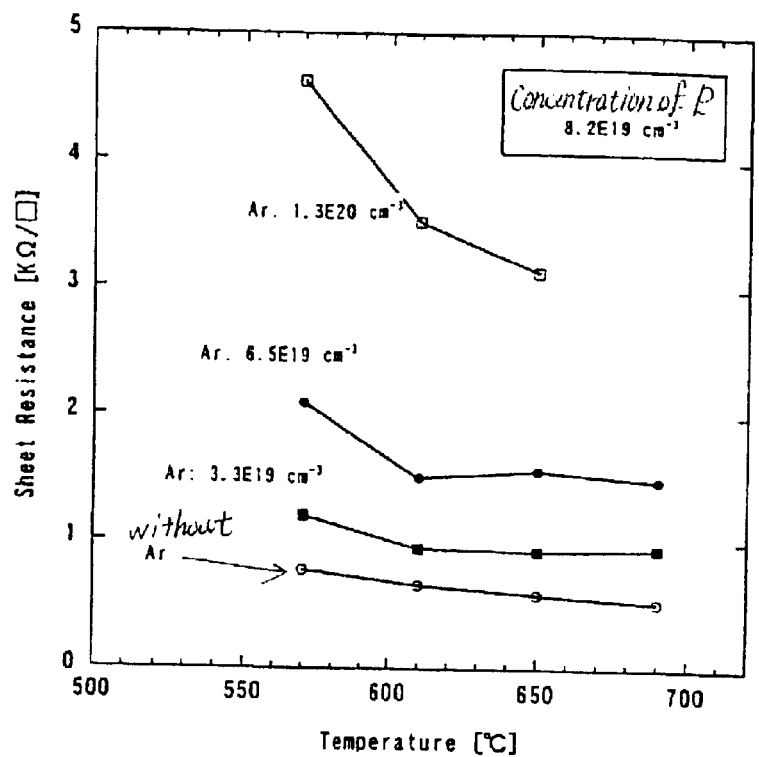
FIGS. 11A and 11B show results of measurement of a sheet resistance.
Figure 11B:
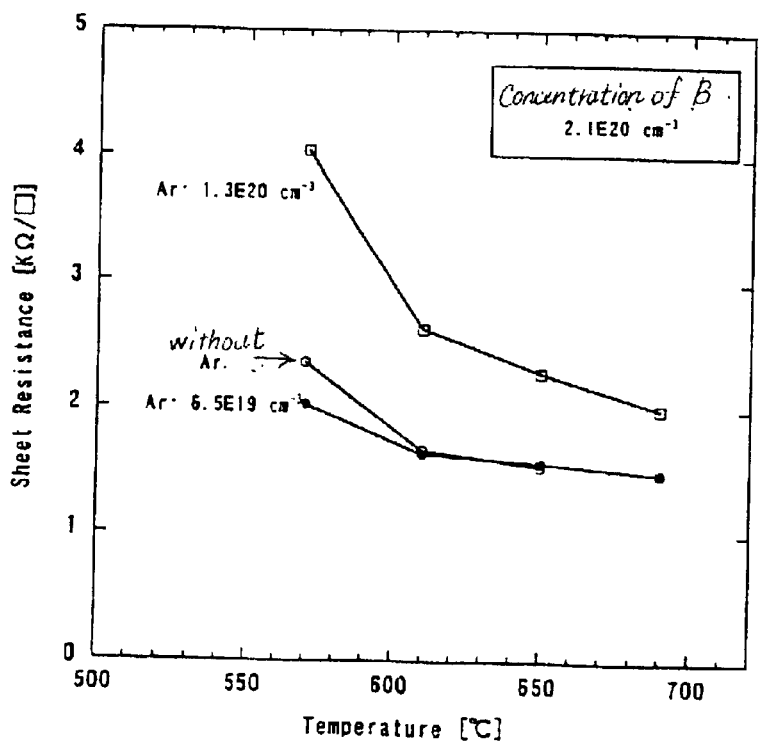

FIGS. 11A and 11B show results of measuring a sheet resistance of a sample to which gettering is conducted in accordance with the present invention.

In order to compare argon addition concentration dependency of the sheet resistance, the measurement is carried out on samples 1 to 4 among which the argon addition concentration is varied with a constant concentration of an n-type impurity element (phosphorous), and samples 5 to 7 among which the argon addition concentration is varied with a constant concentration of a p-type impurity element (boron). The detailed impurity concentrations of the measured samples are shown in Table 2.

TABLE 2

| sample | Argon (Ar) Concentration (/cm$^3$) |
|---|---|
| phosphorous (P) Concentration: $8.2 \times 10^{19}$ /cm$^3$ Treatment Temperature: 570° C., 610° C., 650° C., 690° C. Treatment Time: 5 min. | |
| Sample 1 | — |
| Sample 2 | $3.3 \times 10^{19}$/cm$^3$ |
| Sample 3 | $6.5 \times 10^{19}$/cm$^3$ |
| Sample 4 | $1.3 \times 10^{20}$/cm$^3$ |
| Boron (B) Concentration: $2.1 \times 10^{20}$/cm$^3$ Treatment Temperature: 570° C., 610° C., 650° C., 690° C. TreatmentTime: 5 min. | |
| Sample 5 | — |
| Sample 6 | $6.5 \times 10^{19}$/cm$^3$ |
| Sample 7 | $1.3 \times 10^{20}$/cm$^3$ |

Note that FIGS. 11A and 11B show the results of measuring the sheet resistance of the samples 1 to 7 shown in Table 2 after 5-minute heat treatment at any temperature of 570° C., 610° C., 650° C., or 690° C.

Regarding the samples 1 to 4 to which phosphorous (P) is added, the lowest sheet resistance can be obtained in the sample 1 according to the present invention, to which argon (Ar) is not added.

Further, as to the samples 5 to 8 to which boron (B) is added, the sheet resistance does not rise so much even when both boron (B) and argon (Ar) are added.

Accordingly, the semiconductor film with satisfactory crystallinity can be formed by using the catalytic element when the present invention is applied. Further, the catalytic element can be sufficiently gettered without generation of NiSi$_x$ in the semiconductor layer. Thus, a satisfactory semiconductor device can be realized without deterioration of the sheet resistance due to the impurity element added to the source region or drain region that becomes the gettering region.

[Embodiment 6]

A CMOS circuit and a pixel portion formed in accordance with the present invention can be used for an active matrix display (a liquid crystal display device). In other words, the present invention can be applied to all electronic equipments incorporating the liquid crystal display device with the display portion.

As the electronic equipment, a video camera, a digital camera, a projector (rear or front type), a head mounted display (goggle type display), a personal computer, a portable information terminal (mobile computer, cellular phone, electronic book, etc.), and the like can be enumerated. Examples of these are shown in FIGS. 12, 13 and 14.

Figures 12A, 12B:
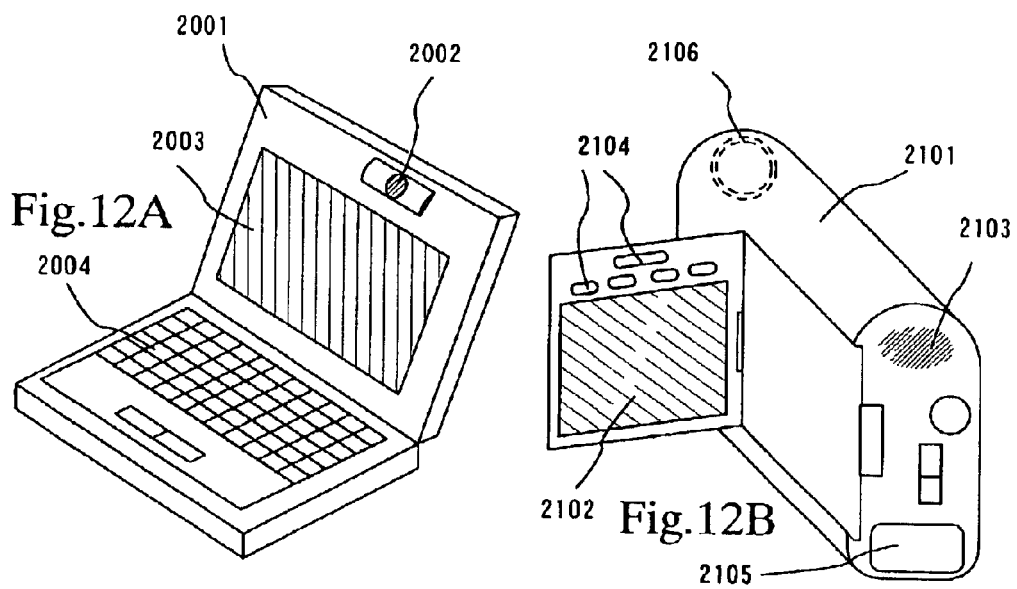
FIGS. 12A to 12F show examples of electric equipment.

FIG. 12(A) shows a personal computer including a main body 2001, an image input portion 2002, a display portion 2003, and a keyboard 2004, etc.

FIG. 12(B) shows a video camera including a main body 2101, a display portion 2102, an audio input portion 2103, an operation switch 2104, a battery 2105, and an image receiving portion 2106, etc.

Figures 12C, 12D:
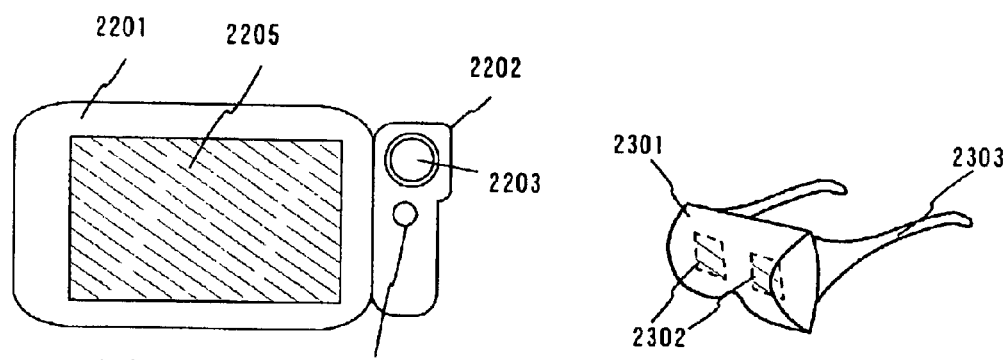

FIG. 12(C) shows a mobile computer including a main body 2201, a camera portion 2202, an image receiving portion 2203, an operation switch 2204, and a display portion 2205, etc.

FIG. 12(D) shows a goggle type display including a main body 2301, a display portion 2302, and an arm portion 2303, etc.

Figure 12E:
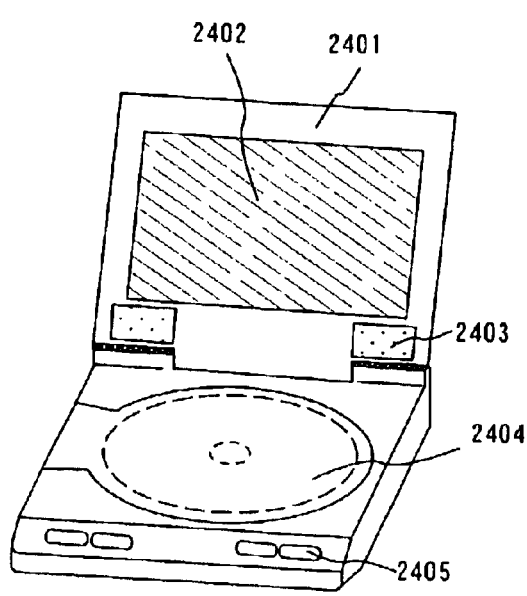

FIG. 12(E) shows a player using a recording medium records a program (hereinafter referred to as a "recording medium"), including a main body 2401, a display portion 2402, a speaker portion 2403, a recording medium 2404, and an operation switch 2405, etc. This device uses a DVD (Digital Versatile Disc), CD, or the like for the recording medium, and can perform music appreciation, film appreciation, games and the use for Internet.

Figure 12F:
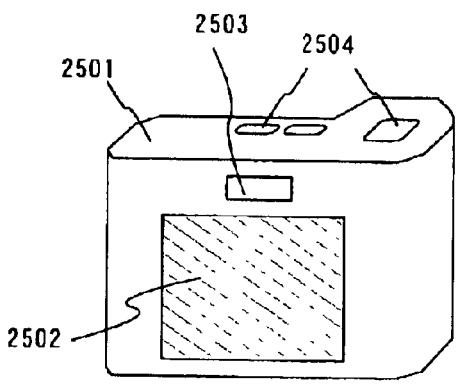

FIG. 12(F) shows a digital camera including a main body 2501, a display portion 2502, a viewfinder 2503, an operation switch 2504, and an image receiving portion (not shown), etc.

FIG. 13(A) shows a front type projector including a projection device 2601 and a screen 2602, etc.

FIG. 13(B) shows a rear type projector including a main body 2701, a projection device 2702, a mirror 2703, and a screen 2704, etc.

FIG. 13(C) is a view showing a structure of the projection device 2601,2702 in FIG. 13(A) and FIG. 13(B). The projection device 2601,2702 includes a light-source optical system 2801, mirrors 2802, 2804–2806, a dichroic mirror 2803, a prism 2807, a liquid crystal display device 2808, a phase difference plate 2809 and a projection optical system 2810. The projection optical system 2810 includes an optical system containing a projection lens. Although the embodiment showed an example of three-plate type, the invention is not especially limited thereto, For example, it may be a single-plate type. Meanwhile, the practitioner may properly provide an optical system, such as an optical lens, a film having a polarization property, a film for adjusting a phase difference, IR film or the like, in an optical path shown at the arrow in FIG. 13(C).

FIG. 13(D) is a view showing an example of a structure of the light-source optical system 2801 in FIG. 13(C). In the embodiment, the light-source optical system 2801 includes a reflector 2811, a light source 2812, a lens array 2813, 2814, a polarization converter 2815 and a focus lens 2816. Incidentally, the light-source optical system shown in FIG. 13D is one example and the invention is not limited thereto. For example, the practitioner may provide an optical system, such as an optical lens, a film having a polarization property, a film for adjusting a phase difference, IR film or the like, in the optical system.

However, according to the projectors shown in FIG. 13, there is shown a case of using a transmission type electro-optical device and an example of applying a reflection type electro-optical device is not illustrated.

Figure 14A:
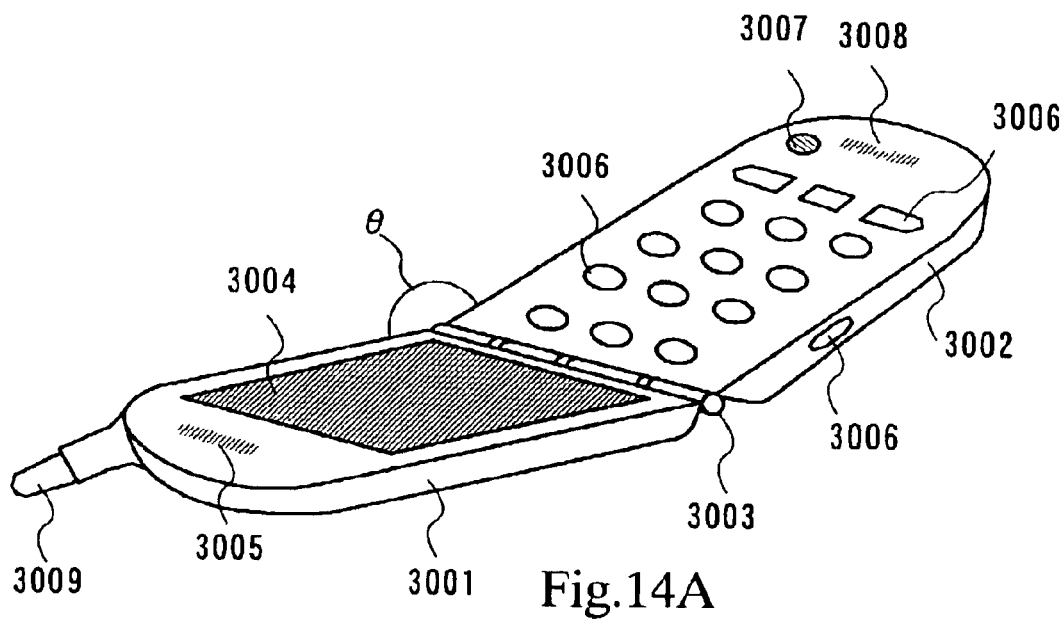
FIGS. 14A to 14C show examples of electric equipment.

FIG. 14(A) shows a cellular phone including a display panel 3001 and an operation panel 3002. The display panel 3001 and the operation panel 3002 are connected to each other in a connection portion 3003. In the connection portion 3003, the angle θ of a face, which is provided a display portion 3004 of the display panel 3001, and a face, which is provided an operation key 3006 of the operation panel 3002, can be changed arbitrary.

Figure 14B:
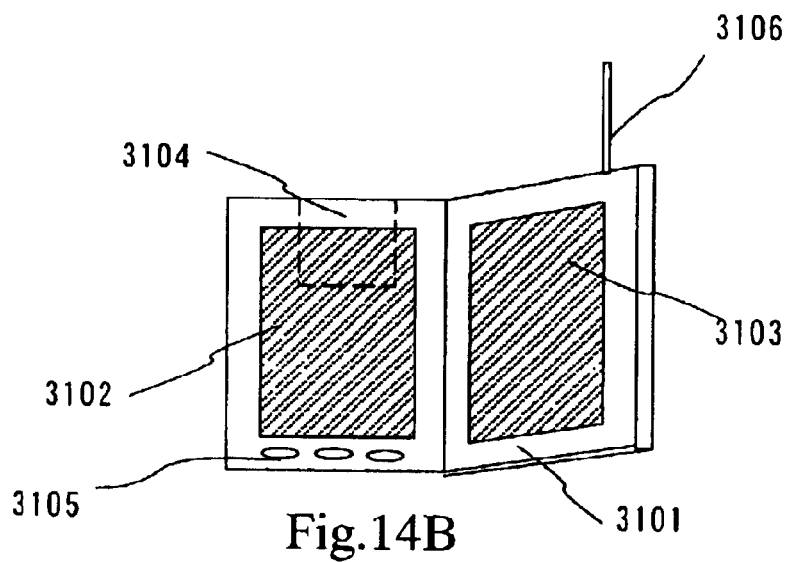

FIG. 14(B) shows a portable book (electronic book) including a main body 3101, a display portion 3102, 3103, a recording medium, an operation switch, and an antennal, etc.

Figure 14C:
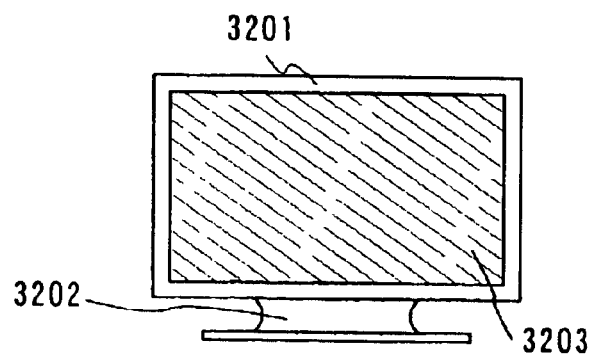

FIG. 14(C) shows a display including a main body 3201, a support base 3202, and a display portion 3203, etc. The display according to the invention is advantageous particularly in the case of large screen formation and is advantageous in the display having a diagonal length of 10 inch or more (particularly, 30 inch or more).

As described above, the applicable range of the present invention is extremely wide, and the invention can be applied to electronic equipments in all fields.

The n-type impurity element is added to the gettering region of the n-channel TFT, the p-type impurity element and the rare gas element are added to the gettering region of the p-channel TFT, and then the heat treatment is performed, whereby the catalytic element (Ni) that remains in the semiconductor layer can be gettered without precipitation of $NiSi_x$. By applying the present invention, the TFT with high reliability can be manufactured.

Further, when the present invention is applied, the high concentration of n-type impurity element is not added to the source region or the drain region of the p-channel TFT. Thus, it is possible to suppress the added amount (concentration) of the p-type impurity element, which was excessively added in a conventional case in order to reverse the n-type, to the necessary and minimum level, and thus, throughput is improved. Further, since the impurity elements are not excessively added, the crystallinity is not broken so much, and recrystallization is satisfactory realized. As a result, the resistance of the source region or the drain region does not rise. Accordingly, the reduction of the on current can also be improved.

What is claimed is:

1. A semiconductor device comprising an n-channel TFT and a p-channel TFT over the same substrate, wherein each of the n-channel TFT and the p-channel TFT comprises a semiconductor layer comprising at least a channel forming region, a source region, and a drain region, and wherein at least one of the source region and the drain region of the p-channel TFT comprises a p-type impurity element and a rare gas element, wherein a concentration of the rare gas element in the source and drain regions of the p-channel TFT is higher than that in the source and drain regions of the n-channel TFT.

2. A semiconductor device comprising an n-channel TFT and a p-channel TFT over the same substrate, wherein each of the n-channel TFT and the p-channel TFT comprises a semiconductor layer comprising at least a channel forming region, a source region, and a drain region, wherein at least one of the source region and the drain region of the n-channel TFT comprises an n-type impurity element, and wherein at least one of the source region and the drain region of the p-channel TFT comprises a p-type impurity element and a rare gas element, wherein a concentration of the rare gas element in said at least one of the source and drain regions of the n-channel TFT is higher than that in the source and drain regions of the n-channel TFT.

3. A semiconductor device according to claim 1, wherein the semiconductor layer comprises a low concentration impurity region.

4. A semiconductor device according to claim 2, wherein the semiconductor layer comprises a low concentration impurity region.

5. A semiconductor device according to claim 1, wherein each of the n-channel TFT and the p-channel TFT comprises the a gate insulating film on the semiconductor layer and a gate electrode on the gate insulating film.

6. A semiconductor device according to claim 2, wherein each of the n-channel TFT and the p-channel TFT comprises the a gate insulating film on the semiconductor layer and a gate electrode on the gate insulating film.

7. A semiconductor device comprising an n-channel TFT and a p-channel TFT over the same substrate, wherein each of the n-channel TFT and the p-channel TFT comprises: a gate electrode over the substrate; a gate insulating film on the gate electrode; and a semiconductor layer on the gate insulating film, wherein the semiconductor layer comprises a channel forming region, a source region, and a drain region, and wherein at least one of the source region and the drain region of the p-channel TFT comprises a p-type impurity element and a rare gas element, wherein a concentration of the rare gas element in said at least one of the source and drain regions of the p-channel TFT is higher than that in the source and drain regions of the n-channel TFT.

8. A semiconductor device comprising an n-channel TFT and a p-channel TFT over the same substrate, wherein each of the n-channel TFT and the p-channel TFT comprises: a gate electrode over the substrate; a gate insulating film on the gate electrode; and a semiconductor layer on the gate insulating film, wherein the semiconductor layer comprises a channel forming region, a source region, and a drain region, wherein at least one of the source region and the drain region of the n-channel TFT comprises an n-type impurity element, and wherein at least one of the source region and the drain region of the p-channel TFT comprises a p-type impurity element and a rare gas element, wherein a concentration of the rare gas element in said at least one of the source and drain regions of the p-channel TFT is higher than that in the source and drain regions of the n-channel TFT.

9. A semiconductor device comprising a first n-channel TFT, a p-channel TFT, and a second n-channel TFT formed in a pixel portion over the same substrate, wherein the first n-channel TFT comprises: a first semiconductor layer comprising a channel forming region, a source region, a drain region, and a first impurity region containing a first concentration of n-type impurity element; a gate insulating film on the semiconductor layer; and a gate electrode on the gate insulating film, wherein the gate electrode comprises a lamination layer of a first conductive film and a second conductive film, wherein a part of the first conductive film overlaps the first impurity region through the gate insulating film, wherein the p-channel TFT comprises: a second semiconductor layer comprising a channel forming region, a source region, a drain region, and a low concentration impurity region; a gate insulating film on the semiconductor layer; and a gate electrode on the gate insulating film, wherein the second n-channel TFT formed in the pixel portion comprises: a third semiconductor layer comprising: a channel forming region, a source region, a drain region, and a second impurity region containing a second concentration of n-type impurity element; a gate insulating film on the semiconductor layer; and a gate electrode on the gate insulating film, wherein at least one of the source region and the drain region in each of the first n-channel TFT and the second n-channel TFT comprises an n-type impurity element, and wherein at least one of the source region and the drain region of the p-channel TFT comprises a p-type impurity element and a rare gas element, wherein a concentration of the rare gas element in said at least one of the source and drain regions of the p-channel TFT is higher than that in the source and drain regions of the n-channel TFT.

10. A semiconductor device according to claim 1, wherein the semiconductor layer comprises a catalytic element that promotes crystallization of an amorphous silicon film.

11. A semiconductor device according to claim 2, wherein the semiconductor layer comprises a catalytic element that promotes crystallization of an amorphous silicon film.

12. A semiconductor device according to claim 7, wherein the semiconductor layer comprises a catalytic element that promotes crystallization of an amorphous silicon film.

13. A semiconductor device according to claim 8, wherein the semiconductor layer comprises a catalytic element that promotes crystallization of an amorphous silicon film.

14. A semiconductor device according to claim 9, wherein the semiconductor layer comprises a catalytic element that promotes crystallization of an amorphous silicon film.

15. A semiconductor device according to claim 10, wherein a concentration of the catalytic element in the source region or the drain region is higher than in the channel forming region.

16. A semiconductor device according to claim 11, wherein a concentration of the catalytic element in the source region or the drain region is higher than in the channel forming region.

17. A semiconductor device according to claim 12, wherein a concentration of the catalytic element in the source region or the drain region is higher than in the channel forming region.

18. A semiconductor device according to claim 13, wherein a concentration of the catalytic element in the source region or the drain region is higher than in the channel forming region.

19. A semiconductor device according to claim 14, wherein a concentration of the catalytic element in the source region or the drain region is higher than in the channel forming region.

20. A semiconductor device according to claim 2, wherein a concentration of an n-type impurity element in the source region or the drain region of the n-channel TFT is $5\times10^{19}$ to $5\times10^{21}/cm^3$.

21. A semiconductor device according to claim 8, wherein a concentration of an n-type impurity element in the source region or the drain region of the n-channel TFT is $5\times10^{19}$ to $5\times10^{21}/cm^3$.

22. A semiconductor device according to claim 9, wherein a concentration of an n-type impurity element in the source region or the drain region of the n-channel TFT is $5\times10^{19}$ to $5\times10^{21}/cm^3$.

23. A semiconductor device according to claim 1, wherein a concentration of the p-type impurity element in the source region or the drain region of the p-channel TFT is $1\times10^{19}$ to $5\times10^{21}/cm^3$.

24. A semiconductor device according to claim 2, wherein a concentration of the p-type impurity element in the source region or the drain region of the p-channel TFT is $1\times10^{19}$ to $5\times10^{21}/cm^3$.

25. A semiconductor device according to claim 7, wherein a concentration of the p-type impurity element in the source region or the drain region of the p-channel TFT is $1\times10^{19}$ to $5\times10^{21}/cm^3$.

26. A semiconductor device according to claim 8, wherein a concentration of the p-type impurity element in the source region or the drain region of the p-channel TFT is $1\times10^{19}$ to $5\times10^{21}/cm^3$.

27. A semiconductor device according to claim 9, wherein a concentration of the p-type impurity element in the source region or the drain region of the p-channel TFT is $1\times10^{19}$ to $5\times10^{21}/cm^3$.

28. A semiconductor device according to claim 1, wherein a concentration of the rare gas element in the source region or the drain region of the p-channel TFT is $1\times10^{19}$ to $1\times10^{22}/cm^3$.

29. A semiconductor device according to claim 2, wherein a concentration of the rare gas element in the source region or the drain region of the p-channel TFT is $1\times10^{19}$ to $1\times10^{22}/cm^3$.

30. A semiconductor device according to claim 7, wherein a concentration of the rare gas element in the source region or the drain region of the p-channel TFT is $1\times10^{19}$ to $1\times10^{22}/cm^3$.

31. A semiconductor device according to claim 8, wherein a concentration of the rare gas element in the source region or the drain region of the p-channel TFT is $1\times10^{19}$ to $1\times10^{22}/cm^3$.

32. A semiconductor device according to claim 9, wherein a concentration of the rare gas element in the source region or the drain region of the p-channel TFT is $1\times10^{19}$ to $1\times10^{22}/cm^3$.

33. A semiconductor device according to claim 2, wherein the n-type impurity element is an element that belongs to group 15 of the periodic table.

34. A semiconductor device according to claim 8, wherein the n-type impurity element is an element that belongs to group 15 of the periodic table.

35. A semiconductor device according to claim 9, wherein the n-type impurity element is an element that belongs to group 15 of the periodic table.

36. A semiconductor device according to claim 1, wherein the p-type impurity element is an element that belongs to group 13 of the periodic table.

37. A semiconductor device according to claim 2, wherein the p-type impurity element is an element that belongs to group 13 of the periodic table.

38. A semiconductor device according to claim 7, wherein the p-type impurity element is an element that belongs to group 13 of the periodic table.

39. A semiconductor device according to claim 8, wherein the p-type impurity element is an element that belongs to group 13 of the periodic table.

40. A semiconductor device according to claim 9, wherein the p-type impurity element is an element that belongs to group 13 of the periodic table.

41. A semiconductor device according to claim 1, wherein the rare gas element is one or a plurality of kinds selected from the group consisting of argon (Ar), helium (He), neon (Ne), krypton (Kr), and xenon (Xe).

42. A semiconductor device according to claim 2, wherein the rare gas element is one or a plurality of kinds selected from the group consisting of argon (Ar), helium (He), neon (Ne), krypton (Kr), and xenon (Xe).

43. A semiconductor device according to claim 7, wherein the rare gas element is one or a plurality of kinds selected from the group consisting of argon (Ar), helium (He), neon (Ne), krypton (Kr), and xenon (Xe).

44. A semiconductor device according to claim 8, wherein the rare gas element is one or a plurality of kinds selected from the group consisting of argon (Ar), helium (He), neon (Ne), krypton (Kr), and xenon (Xe).

45. A semiconductor device according to claim 9, wherein the rare gas element is one or a plurality of kinds selected from the group consisting of argon (Ar), helium (He), neon (Ne), krypton (Kr), and xenon (Xe).

46. A semiconductor device comprising an n-channel TFT and a p-channel TFT over the same substrate,
wherein each of the n-channel TFT and the p-channel TFT comprises a semiconductor layer comprising at least a channel forming region, a source region, and a drain region,
wherein the semiconductor layer comprises a catalytic element that promotes crystallization of an amorphous silicon film, and
wherein the catalytic element exists in a solubilized state between silicon lattices in the semiconductor layer,
wherein a concentration of a rare gas element contained in the source and drain regions of the p-channel TFT is higher than that in the source and drain regions of the n-channel TFT.

47. A semiconductor device according to claim 46, wherein the semiconductor layer comprises a low concentration impurity region.

48. A semiconductor device according to claim 46, wherein each of the n-channel TFT and the p-channel TFT comprises the a gate insulating film on the semiconductor layer and a gate electrode on the gate insulating film.

49. A semiconductor device comprising an n-channel TFT and a p-channel TFT over the same substrate,
wherein each of the n-channel TFT and the p-channel TFT comprises: a gate electrode over a substrate, a gate insulating film on the gate electrode, and a semiconductor layer on the gate insulating film,
wherein the semiconductor layer comprises a channel forming region, a source region, and a drain region,
wherein the semiconductor layer comprises a catalytic element that promotes crystallization of an amorphous silicon film, and
wherein the catalytic element exists in a solubilized state between silicon lattices in the semiconductor layer,
wherein a concentration of a rare gas element contained in the source and drain regions of the p-channel TFT is higher than that in the source and drain regions of the n-channel TFT.

50. A semiconductor device comprising a first n-channel TFT, a p-channel TFT, and a second n-channel TFT formed in a pixel portion over the same substrate,
wherein the first n-channel TFT comprises: a first semiconductor layer comprising a channel forming region, a source region, a drain region, and a first impurity region containing a first concentration of n-type impurity element; a gate insulating film on the semiconductor layer; and a gate electrode on the gate insulating film,
wherein the gate electrode comprises a lamination layer of a first conductive film and a second conductive film,
wherein a part of the first conductive film overlaps the first impurity region through the gate insulating film,
wherein the p-channel TFT comprises: a second semiconductor layer comprising a channel forming region, a source region, a drain region, and a low concentration impurity region; a gate insulating film on the semiconductor layer; and a gate electrode on the gate insulating film,
wherein the second n-channel TFT formed in the pixel portion comprises: a third semiconductor layer comprising: a channel forming region, a source region, a drain region, and a second impurity region containing a second concentration of n-type impurity element; a gate insulating film on the semiconductor layer; and a gate electrode on the gate insulating film,
wherein each of the first, second, and third semiconductor layers comprises a catalytic element that promotes crystallization of an amorphous silicon film, and
wherein the catalytic element exists in a solubilized state between silicon lattices in the semiconductor layer,
wherein a concentration of a rare gas element contained in the source and drain regions of the p-channel TFT is higher than that in the source and drain regions of the n-channel TFT.

51. A semiconductor device according to claim 46, wherein an etch pit is not generated in the source region and in the drain region in the semiconductor layer from the result of an etching test with an FPM solution.

52. A semiconductor device according to claim 49, wherein an etch pit is not generated in the source region and in the drain region in the semiconductor layer from the result of an etching test with an FPM solution.

53. A semiconductor device according to claim 50, wherein an etch pit is not generated in the source region and in the drain region in the semiconductor layer from the result of an etching test with an FPM solution.

54. A semiconductor device according to claim 51, wherein the etching test with the FPM solution employs the FPM solution containing hydrofluoric acid at a concentration of 0.5% and hydrogen peroxide at a concentration of 0.5% and is performed for 30 to 60 minutes at a liquid temperature of 15 to 30° C.

55. A semiconductor device according to claim 52, wherein the etching test with the FPM solution employs the FPM solution containing hydrofluoric acid at a concentration of 0.5% and hydrogen peroxide at a concentration of 0.5% and is performed for 30 to 60 minutes at a liquid temperature of 15 to 30° C.

56. A semiconductor device according to claim 53, wherein the etching test with the FPM solution employs the FPM solution containing hydrofluoric acid at a concentration of 0.5% and hydrogen peroxide at a concentration of 0.5% and is performed for 30 to 60 minutes at a liquid temperature of 15 to 30° C.

57. A semiconductor device according to claim 46, wherein a concentration of the catalytic element in the semiconductor layer is higher in the source region or in the drain region than in the channel forming region.

58. A semiconductor device according to claim 49, wherein a concentration of the catalytic element in the semiconductor layer is higher in the source region or in the drain region than in the channel forming region.

59. A semiconductor device according to claim 50, wherein a concentration of the catalytic element in the semiconductor layer is higher in the source region or in the drain region than in the channel forming region.

60. A semiconductor device according to claim 1, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

61. A semiconductor device according to claim 2, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

62. A semiconductor device according to claim 7, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

63. A semiconductor device according to claim 8, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

64. A semiconductor device according to claim 9, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

65. A semiconductor device according to claim 46, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

66. A semiconductor device according to claim 49, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

67. A semiconductor device according to claim 50, wherein the catalytic element is one or a plurality of kinds selected from the group consisting of nickel (Ni), ferrum (Fe), cobalt (Co), ruthenium (Ru), palladium (Pa), osmium (Os), iridium (Ir), platinum (Pt), copper (Cu), and gold (Au).

* * * * *